US006304837B1

(12) United States Patent  
Geiger et al.

(10) Patent No.: US 6,304,837 B1  
(45) Date of Patent: Oct. 16, 2001

(54) AUTOMATED TEST VECTOR GENERATION AND VERIFICATION

(75) Inventors: Thomas Kennith Geiger, Fremont; Honda Yang, Santa Clara; Bruce Pember, Redwood City, all of CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/160,553

(22) Filed: Sep. 24, 1998

Related U.S. Application Data

(60) Provisional application No. 60/075,631, filed on Feb. 21, 1998.

(51) Int. Cl.[7] .............................. G06G 7/48; G06F 17/50
(52) U.S. Cl. .................................................. 703/14; 716/4
(58) Field of Search ................................ 703/14; 716/4

(56) References Cited

U.S. PATENT DOCUMENTS

| | | | |
|---|---|---|---|
| 5,535,223 | * 7/1996 | Horstmann et al. | 714/744 |
| 5,684,808 | * 11/1997 | Valind . | |
| 5,696,772 | * 12/1997 | Lesmeister | 714/32 |
| 5,974,241 | * 10/1999 | Fusco | 716/2 |
| 5,974,248 | 10/1999 | Graef . | |
| 5,983,381 | 11/1999 | Chakradhar et al. . | |
| 5,995,740 | * 11/1999 | Johnson | 703/20 |
| 6,047,247 | 4/2000 | Iwanishi et al. . | |

OTHER PUBLICATIONS

Cummings: "Generating ASIC test vectors eith Verilog"; IEEE 1994 Int. Verilog HDL Conf.; pp. 63–70 Mar. 1994.*
Westfall: "Memory test–debugging test vectors without ATE"; IEEE 1997 Int. Test Conf.; pp. 663–669 Nov. 1997.*
Ho et al.: "Architecture validation for processors"; IEEE: Proc. 22nd Annual Int. Symp. Comp. Arch.; pp. 404–413 Jun. 1995.*

Huston, R.E., "Pin Margin Analysis", Proceedings International Test Conference, pp. 655–662, Nov. 1997.
Sakashita et al., "A Built–In Self–Test Circuit with Timing and Margin Test Function in a 1 Gbit Synchronous DRAM", Proceedings International Test Conference, pp. 319–324, Oct. 1996.

(List continued on next page.)

*Primary Examiner*—Kevin J. Teska
*Assistant Examiner*—Hugh Jones
(74) *Attorney, Agent, or Firm*—Martine & Penilla, LLP

(57) ABSTRACT

Disclosed is a method for generating AVF test file data for use in testing a simulation of an integrated circuit design, and verifying the generated AVF test file data before they are delivered to a physical silicon version of the integrated circuit design. The generation method includes providing a map file that contains a plurality of identifying statements for each multiple port I/O cell (or also including single port I/O cells) in the integrated circuit design. Then, generate a verilog executable file for the integrated circuit design. The verilog executable file is configured to contain data associated with the map file, a netlist of the integrated circuit design, output enable data derived from the netlist, and AVF data conversion information. The method further comprises executing the verilog executable file along with a test bench that includes the netlist of the integrated circuit design, a set of test files, and models. The execution is configured to produce the AVF test file data and a DUT timing file data. The generated data is then processed through a verification loop that is configured to identify in a log all of the possible errors with the generated test data. The input data used to generate the AVF test file data may then be modified to enable the re-generation of new AVF test file data and new DUT timing file data. If errors are still present, the loop may again be re-run, if the errors are of the kind that would necessitate correction. Once the verification loop has been run to the satisfaction of the test engineer, the test vector data can be applied to the physical test station for use on the physical silicon chip.

15 Claims, 19 Drawing Sheets

OTHER PUBLICATIONS

Kamon et al., "Interconnect Parasitic Extraction in the Digital IC Design Methodology", Digest of Technical Papers IEEE/ACM International Conference on Computer Aided Design, pp. 223–230, Nov. 1999.

Chakraborty, T.J.; Agrawal, V.D., "Simulation of At-Speed Test for Stuck-At Faults", Proceedings 13th IEEE VLSI Test Symposium, 1995. pp. 216–220.

Beker et al., "Extraction of Parasitic Circuit Elements in a PEBB for Application in the Virtual Test Bed", IEEE Industry Applications Converence, vol. 2, pp. 1217–1221, Oct. 1997.

* cited by examiner

| COMMAND LINE ENTRY |
|---|
| > avfgen -v -p -Ochip_avf.v -m chip.map -n top.opus.vs -t u_top -i u_iopad -r 38 |

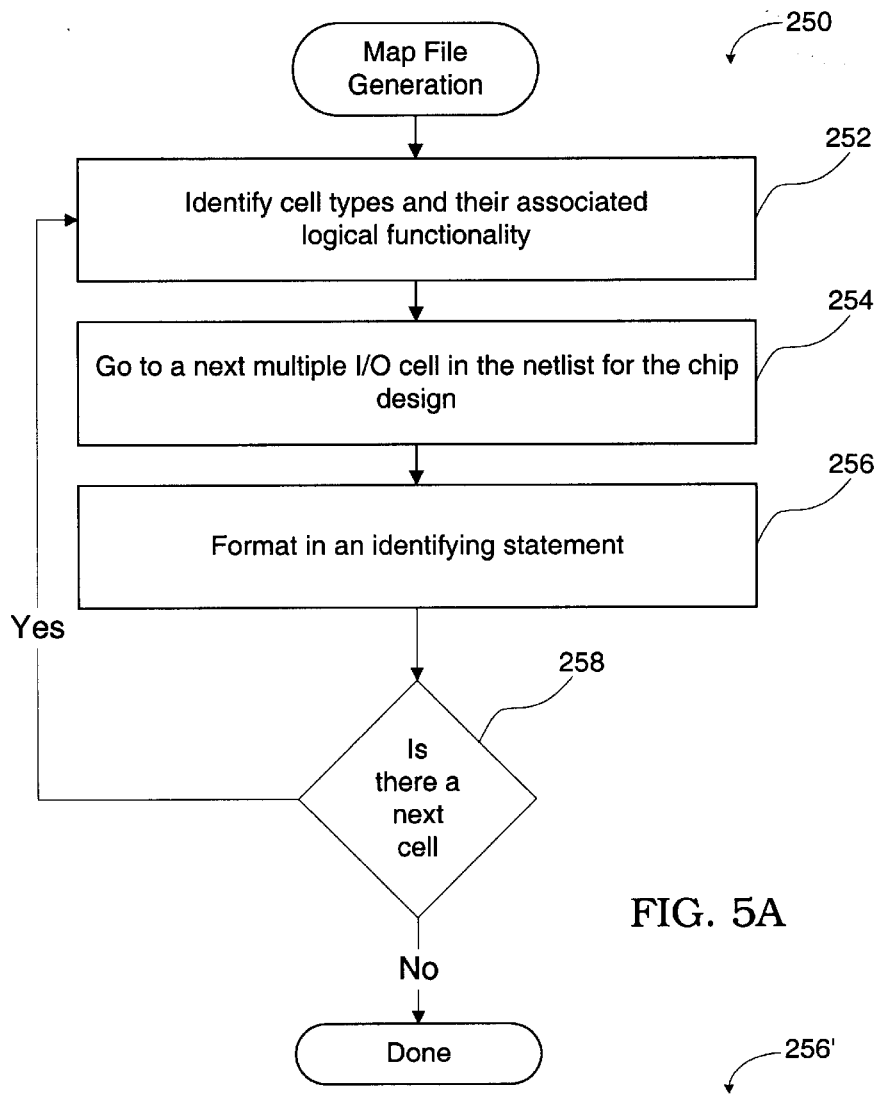
FIG. 5A
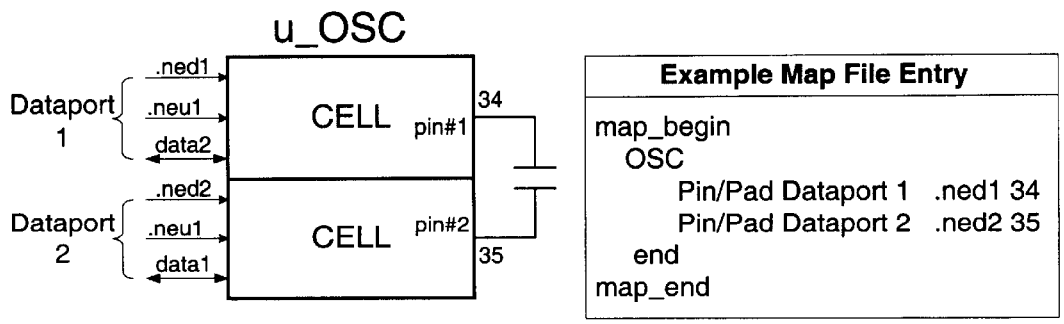
FIG. 5B
FIG. 5C

| EXAMPLE PORT/NET TABLE ||||
| --- | --- | --- | --- |
| *Instance* | *Cell Type* | *Port    Net* | *Port    Net* |
| : | : | : ||
| PAD001 | IO Cell 1 | .neu 1  (Signal 1) | .ned 1  (Signal 2) |
| PAD002 | IO Cell 2 | .neu 1  (Signal 1) | .ned 1  (Signal 2) |
| PAD003 | IO Cell 3 | .neu 1  (Signal 1) | .ned 1  (Signal 2) |
| PAD004 | IO Cell 1 | .neu 1  (Signal 1) | .ned 1  (Signal 2) |
| PAD005-21 (multi-pin) | SCSI Cell 1 | .neu 1  (Signal 1) | .ned 1  (Signal 2) |
| PAD34-35 (multi-pin) | OSC Cell | .ned 1  (Signal 1) .ned 2  (Signal 3) | .neu 1  (Signal 2) .neu 2  (Signal 4) |
| : | : | : ||

/— 210

| AVF DATA CONVERSION Truth Table |||| 
|---|---|---|---|
| *Power On Reset* | *Output Enable* | *Value* | *AVF Data Output* |
| 1 | in | 1 | 1 |
| 1 | in | 0 | 0 |
| 1 | out | 1 | H |
| 1 | out | 0 | L |
| 0 | Don't Care | Don't Care | X |

FIG. 7B

EXEMPLARY STATEMENT TIMING CALCULATION

```
integer  hd0_time;                          initial  hd0_width = 0;
integer  hd0_totalchange;                   initial  hd0_delay = 0;
integer  hd0_cyclechange;                   initial  hd0_tgtype = 0;
integer  hd0_maxchange;                     initial  hd0_counter = 0;
integer  hd0_minchange;                     initial  hd0_totalchange = 0;
integer  hd0_ave;                           initial  hd0_cyclechange = 0;
integer  hd0_num;                           initial  hd0_maxchange = 0;
integer  hd0_width;                         initial  hd0_minchange = 0;
integer  hd0_delay;                         initial  hd0_num = 0;
integer  hd0_tgtype;                        initial  hd0_ave = 0;
integer  hd0_counter;
reg      hd0_strobed;

always @ (avfcycle)
  begin
    if ( (hd0_cyclechange = = 2) & (hd0_counter = = 10) )
      begin
        if (hd0_strobed)
          hd0_tgtype = 1;
        else
          hd0_tgtype = 2;
        $fdisplay (avflogfile, "WARNING: hd[0] has changed twice in 10 different
        $fdisplay (avflogfile, "WARNING: hd[0] is assuming a R%0d with delay = %
      end
    else if (hd0_counter < 10)
      hd0_delay < = 0;
    if (hd0_cyclechange = = 2)
      hd0_counter = hd0_counter +1;
    hd0_cyclechange = 0;
  end
always @ (test.u_top.hd[0] )
  if (hd0_cyclechange < 2)
    hd0_strobed < = test.u_top.hd[0];
always @ (test.u_top.hd[0] )
  if (hd0_oen)
    begin
      hd0_time = $time - cycle_start;
      hd0_totalchange = hd0_totalchange + 1;
      hd0_num = hd0_num + hd0_time;
      hd0_cyclechange = hd0_cyclechange + 1;
      if (hd0_cyclechange > 1) $ (hd0_counter < 10) )
        $fdisplay (avflogfile, "WARNING: hd[0] changes more than once in cycle %0d
      if (hd0_time > hd0_maxchange)
        hd0_maxchange = hd0_time;
      if (hd0_time < hd0_minchange)
        hd0_minchange = hd0_time;
      if ( (hd0_cyclechange = = 1) & (hd0_tgtype = = 0) )
        hd0_delay = hd0_time;
      if ( (hd0_cyclechange = = 2) & (hd0_tgtype = = 0) )
        hd0_ wdith = hd0_time - hd0_delay;
      if (avfclk)
        $fdisplay (avflogfile, "WARNING: hd[0] changes after strobe in cycle %0d",
      else
        if (hd0_totalchange = = 0)
          hd0_ave = 0;
        else
          hd0_ave = hd0_num / hd0_totalchange;
    end
```

FIG. 8B

AUTOMATED TEST VECTOR GENERATION AND VERIFICATION

CROSS REFERENCE TO RELATED APPLICATIONS

This application claims the benefit of U.S. Provisional Patent Application having serial number 60/075,631, filed on Feb. 21, 1998, entitled "Automated Test Vector Generation and Verification." This application is hereby incorporated by reference.

BACKGROUND OF THE INVENTION

1. Field of the Invention

This invention relates generally to integrated circuits, and more particularly to methods for automated test vector generation and verification.

2. Description of the Related Art

Testing integrated circuits that are ultimately fabricated onto silicon chips has over the years increased in complexity as the demand has grown, and continues to grow for faster and more densely integrated silicon chips. In an effort to automate the design and fabrication of circuit designs, designers commonly implement hardware descriptive languages (HDL), such as Verilog, to functionally define the characteristics of the design. The Verilog code is then capable of being synthesized in order to generate what is known as a "netlist." A netlist is essentially a list of "nets," which specify components (know as "cells") and their interconnections which are designed to meet a circuit design's performance constraints. The "netlist" therefore defines the connectivity between pins of the various cells of an integrated circuit design. To fabricate the silicon version of the design, well known "place and route" software tools that make use of the netlist data to design the physical layout, including transistor locations and interconnect wiring.

When testing of the digital model, various test vectors are designed in order to test the integrated circuit's response under custom stimulation. For example, if the integrated circuit is a SCSI host adapter chip, the test vectors will simulate the response of the SCSI host adapter chip as if it were actually connected to a host computer and some kind of peripheral device were connected to the chip. In a typical test environment, a test bench that includes a multitude of different tests are used to complete a thorough testing of the chip. However, running the test vectors of the test bench will only ensure that the computer simulated model of the chip design will work, and not the actual physical chip in its silicon form.

To test a silicon chip 12 after it has been packaged, it is inserted into a loadboard 14 that is part of a test station 10, which is shown in FIG. 1A. Although the model of the chip design was already tested using the test vectors of the test bench, these test vectors are not capable of being implemented in the test station 10 without substantial modifications, to take into account the differences between a "model" and a "physical" design. In the prior art, the conversion of a test model test vector into test vectors that can actually be run on the test station 10 required a very laborious process that was unfortunately prone to computer computational errors as well as human errors. Of course, if any type of error is introduced during the generation of the test vectors that will ultimately be run on the silicon chip 12, the testing results generated by the test station 10 would indicate that errors exist with the part, when in fact, the part functions properly. This predicament is of course quite costly, because fabrication plants would necessarily have to postpone release of a chip until the test station indicated that the part worked as intended.

As mentioned above, the prior art test vector generation methodology was quite laborious, which in many circumstances was exacerbated by the complexity of the tests and size of the chip being tested. The methodology required having a test engineer manually type up the commands necessary to subsequently generate a "print-on-change" file once executed using Verilog. Defining the commands for generating the print-on-change file includes, for example, typing in the output enable information for each pin, defining pin wires, setting up special over-rides for power-on reset pins, etc. At this point, the print-on-change file would then be generated using a Verilog program, which in turn uses the commands generated by the test engineer.

In addition to manually producing these commands, a separate parameter file having timing information is separately produced in a manual typing-in fashion by the engineer. The generated print-on-change file and the parameter file are then processed by a program that is configured to produce a test file, which is commonly referred to as an AVF file. However, the production of the AVF is very computationally intensive because the generated print-on-change file can be quite large. The size of the print-on-change file grows to very large sizes because every time a pin in the design changes states, a line of the print-on-change file is dumped. Thus, the more pins in the design, more CPU time is required to convert the print-on-change file into a usable AVF file. In some cases where the test is very large or complex, the host computer processing the print-on-change file is known to crash or in some cases lock-up due to the shear voluminous amount of data.

Unfortunately, as mentioned above, the generated AVF file may have defects, such as timing errors, which may translate into errors being reported by the test station 10. The problem here is that the test station 10 will stimulate the part differently than the stimulation designed for the digital version. This problem therefore presents a very time consuming test and re-test of the part by the test station 10. When re-testing is performed, many modifications to the parameter file, containing timing information, are performed in an effort to debug errors with the AVF file. Although some parts are in fact defective in some way, the test engineer is still commonly required to re-run the tests to determine whether the errors are due to a defective AVF file or the physical device.

In view of the foregoing, there is a need for a method that reduces test vector generation cycle time, as well as increases the accuracy of test vector generation and simulation processes. Another need exists for a new method for automating the generation of the initial AVF file, which reduces computation time and reduces test engineer manual interaction that is susceptible to the introduction of errors. There is also a need for a method for automatically verifying whether the generated AVF file is free of defects, which will enable a substantial reduction in test cycle time.

SUMMARY OF THE INVENTION

Broadly speaking, the present invention fills these needs by providing a method to reduce test vector generation cycle time, as well as increase the accuracy of test vector generation and simulation processes. It should be appreciated that the present invention can be implemented in numerous ways, including as a process, an apparatus, a system, a device, a method, or a computer readable medium. Several inventive embodiments of the present invention are described below.

In one embodiment, a method for generating AVF test file data for use in testing a simulation of an integrated circuit design and subsequently testing a physical silicon version of the integrated circuit design is disclosed. The method includes providing a map file that contains a plurality of identifying statements for each multiple port I/O cell in the integrated circuit design. Then, generate a verilog executable file for the integrated circuit design. The verilog executable file is configured to contain data associated with the map file, output enable data derived from a netlist, and AVF data conversion information. The method further comprises executing the verilog executable file along with a test bench that includes the netlist of the integrated circuit design, a set of test files, and models. The execution is configured to produce the AVF test file data and a DUT timing file data.

In another embodiment, an automated test vector verification method is disclosed. The method includes receiving an AVF test file of an integrated circuit design and receiving a DUT test file of the integrated circuit design. The method then executes using the AVF test file and the DUT test file to produce an input vector (.invec), an environment file (.env), and an expected output vector (.outvec). Then, the method provides the input vector to a standalone chip on a model test station. Once provided to the standalone chip on a model test station, the method will execute the environment file that causes the input vector to be processed through the standalone chip on the model test station. The executing is configured to produce an output vector from the model test station. Then, the method compares the output vector from the model test station with the expected output vector. Finally, the method will determine whether the comparing produces a match that indicates that the AVF test file data is free of errors. When the AVF test file data is not free of errors, the method further comprises the option of processing through a verification loop.

In this embodiment, the verification loop includes: (a) modifying a test file data that is used to generate the AVF test file data and the DUT test file data; (b) generating a new AVF test file data and a new DUT test file data; (c) running the automated test vector verification method using the new AVF test file data and the new DUT test file data; and (d) determining whether the comparing produces a match that indicates that the AVF test file data is free of errors.

In yet another embodiment, a method for generating AVF test file data for use in testing a simulation of an integrated circuit design and subsequently testing a physical silicon version of the integrated circuit design is disclosed. The method includes providing a map file that contains a plurality of identifying statements for each multiple port I/0 cell in the integrated circuit design. Then generating a verilog executable file for the integrated circuit design. The generation of the verilog executable file includes: (a) reading the map file; (b) reading a netlist of the integrated circuit design; (c) generating a list of pins for the integrated circuit design; (d) defining output enable data for each pin of the integrated circuit design; (e) defining an AVF data conversion function having AVF data conversion information; (f) reading the generated list of pins; (g) generating code that produces timing for a DUT file for each pin in the generated list of pins; (h) generating a display statement; and (i) generating DUT creation code. The method then includes executing the verilog executable file along with a test bench that includes the netlist of the integrated circuit design, a set of test files, and models. The execution is configured to produce the AVF test file data and a DUT timing file data.

In still another embodiment, another automated test vector verification method is disclosed. The method includes receiving an AVF test file and a DUT test file of an integrated circuit design. Executing the AVF test file and the DUT test file to produce an input vector, an environment file, and an expected output vector. Providing the input vector to a standalone chip on a model test station. Executing the environment file that causes the input vector to be processed through the standalone chip on the model test station. The executing is configured to produce an output vector from the model test station. The method then proceeds to comparing the output vector from the model test station with the expected output vector, and determining whether the comparing produces a match that indicates that the AVF test file data is free of errors. The method then includes running the automated test vector verification method for a plurality of test files of the AVF test file data, and generating a test result log.

In another embodiment, a method for generating a map file for I/O cells of an integrated circuit design is disclosed. The map file, in this embodiment, will be generated for both single port and multi port cells. The method includes: (a) generating an output enable equation for a current cell type; (b) determining a port name for a current signal name; (c) inputting the determined port name for the current signal name into the map file; and (d) repeating (a)–(c) once for a single port cell and multiple times for a multi port cell.

These methods of the present invention therefore remove the uncertainty involved with standard vector conversion, by providing an automated way of generating vectors, as well as providing a verification methodology. By automating the vector generation and conversion process, at-speed testing can now accurately be performed. The process of the present invention also automatically senses input timings and creates a timing definition (DUT) file that can be used in the conversion/verification process. This therefore creates a virtually "hands-off" test vector generation/verification methodology.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 5A illustrates a flowchart defining the method operations performed in generating a map file for a particular chip design in accordance with one embodiment of the present invention.

FIGS. 5B and 5C illustrate an example of a multiple I/O port cell and a map file entry in accordance with one embodiment of the present invention.

FIG. 7B illustrates an example of an AVF data conversion truth table, in accordance with one embodiment of the present invention.

FIG. 8B is a table illustrating an exemplary statement timing calculation in accordance with one embodiment of the present invention.

DETAILED DESCRIPTION OF THE PREFERRED EMBODIMENTS

An invention for generating test vectors for use on a physical test station to test a packaged integrated circuit design, and verifying the generated test vectors to ensure that the generated test vectors will actually generate the proper test result data once used on the physical test station. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
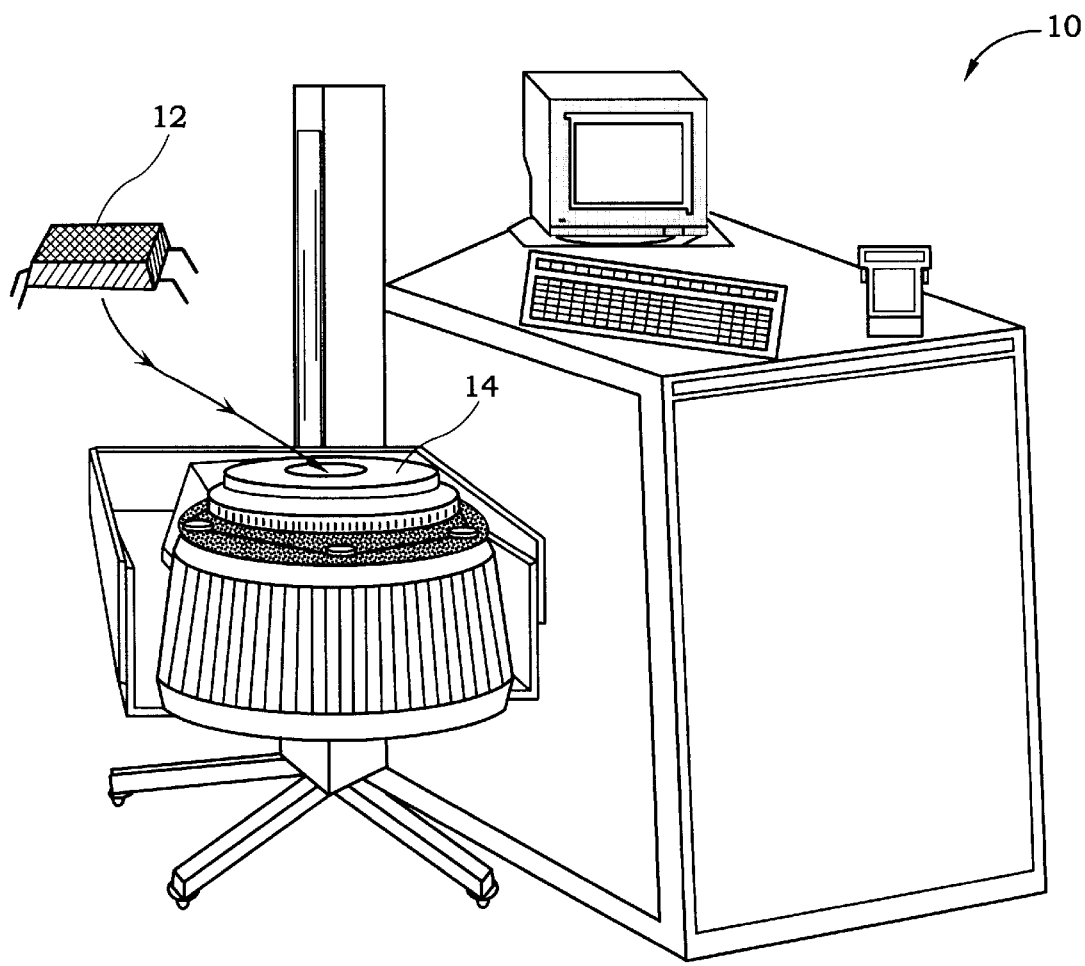
FIG. 1 illustrates a test station that is typically used in testing physical silicon integrated circuit devices.

As discussed above, FIG. 1 illustrates a test station 10 that is typically used in testing integrated circuit devices. The test station 10 typically includes a computer station which is coupled to a unit that has a loadboard 14. The loadboard 14, as is well known in the art, is used to receive integrated circuit devices 12. By the time testing is performed on the test station 10, the integrated circuit device 12 will be in a packaged form and has the proper package pins that will communicate with appropriate electrical receptacles on the loadboard 14. The following description will therefore detail the computer process implemented in automating the generation of test vectors and the automated verification of the test vectors before they are transferred to the test station 10 for use in testing the packaged circuit device 12. Section A will therefore describe the automated generation of the AVF file data and DUT timing file data (e.g., that includes the execution of avfgen and avf.v), and section B will describe the automated verification loop (e.g., that includes the execution of avf2vlg) that is executed to verify the generated AVF file data.

A. Automated AVF and DUT Data Generation

Figure 2:
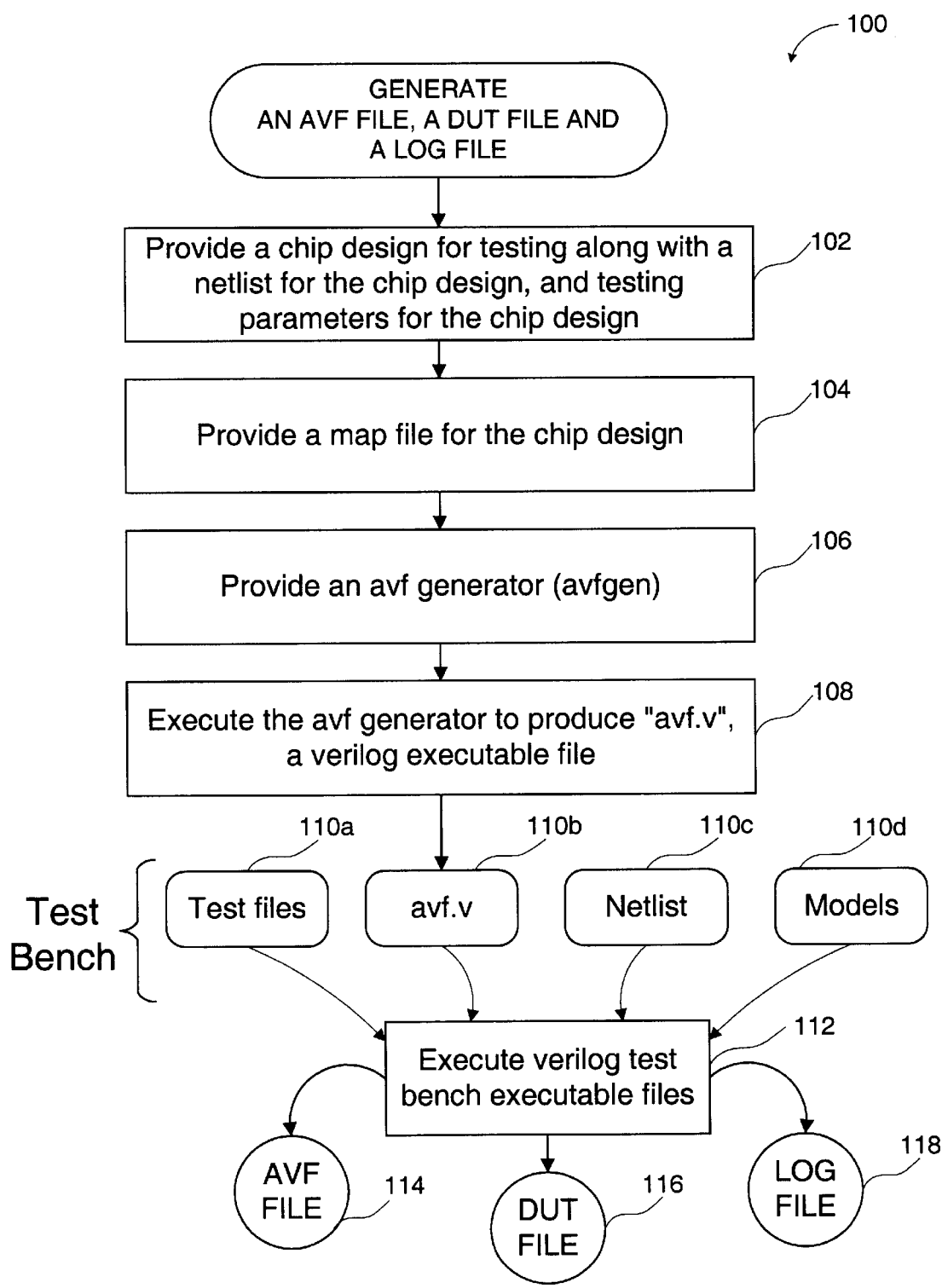
FIG. 2 illustrates a flowchart that details the operations performed in generating an AVF file, a DUT file, and a log file in accordance with one embodiment of the present invention.

FIG. 2 illustrates a flowchart 100 that details the operations performed in generating an AVF file, a DUT file, and a log file in accordance with one embodiment of the present invention. The method begins at an operation 102 where a chip design is provided for testing along with a netlist for the chip design. Also provided are testing parameters for the chip design, such as the file names for the chip design, the file name for the netlist, whether or not debugging information will be generated along with the file, instantiations for the chip and the I/O pads, the pin number for the power-on reset pin, etc.

Once these testing parameters have been provided in operation 102, the method will proceed to an operation 104 where a map file is provided for the chip design. As will be described below with reference to FIGS. 5A through 5C, the map file will identify a port/pin map list for each of the multiple port cells. Accordingly, for each multi-port cell, the instance for the cell, the ports for the cell, the enable information for the cell, and the pin numbers for the cell will be generated as an entry in the map file. Once a map file having a plurality of entries for each of the multi-port cells is provided, the method will proceed to an operation 106.

In operation 106, an AVF generator (avfgen) is provided, which is configured to be executed by using the information provided in operations 102 and 104. The method now proceeds to operation 108 where the AVF generator is executed to produce an "avf.v" file, which is a Verilog executable file. The avf.v file is then provided as part of a test bench for testing the target chip design. As shown, the test bench will generally include test files 110*a*, the avf.v file 110*b*, a netlist 110*c* for the chip design, and a set of models 110*d*. The test files 110*a* include information that details the wiring information for interconnecting the chip design to the set of models 110*d*. In addition, the test files 110*a* also include information that will detail the commands that are designed to stimulate the chip design under test and in accordance with the appropriate timing.

It should be noted that the avf.v file 110*b* is a generic file that will work with all of the tests provided in the test files 110*a*. Once the test bench has been established, the method will proceed to make the test bench information accessible to operation 112, where the test bench is executed to generate an AVF file 114, a DUT file 116, and a log file 118.

Figure 3:
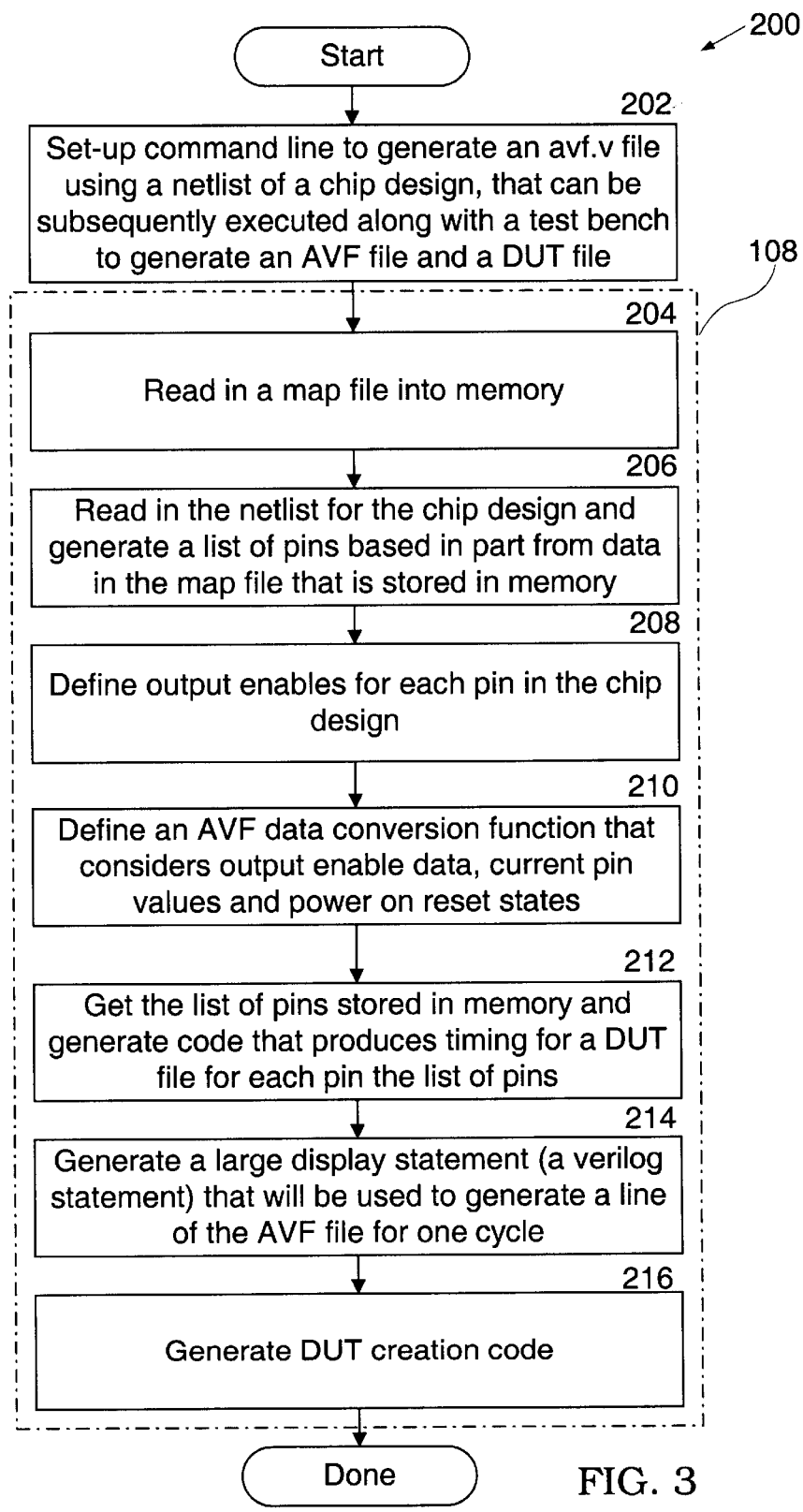
FIG. 3 illustrates a flowchart which illustrates the execution of the AVF generator (avfgen) that is configured to produce an avf.v file in accordance with one embodiment of the present invention.

FIG. 3 illustrates a flowchart 200 which illustrates the execution of the AVF generator that is configured to produce the avf.v file as described with reference to 108 of FIG. 2. Initially, the method begins at an operation 202 where the command line is set up to generate an avf.v file using a netlist of the chip design. As mentioned above, the avf.v file can then be subsequently executed along with a test bench in order to generate the desired AVF file and the DUT file.

Figure 4A:
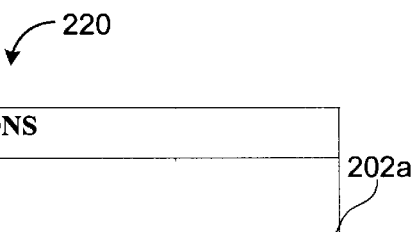
FIG. 4A illustrate example AVF generator commands in accordance with one embodiment of the present invention.
Figures 4B, 4C:
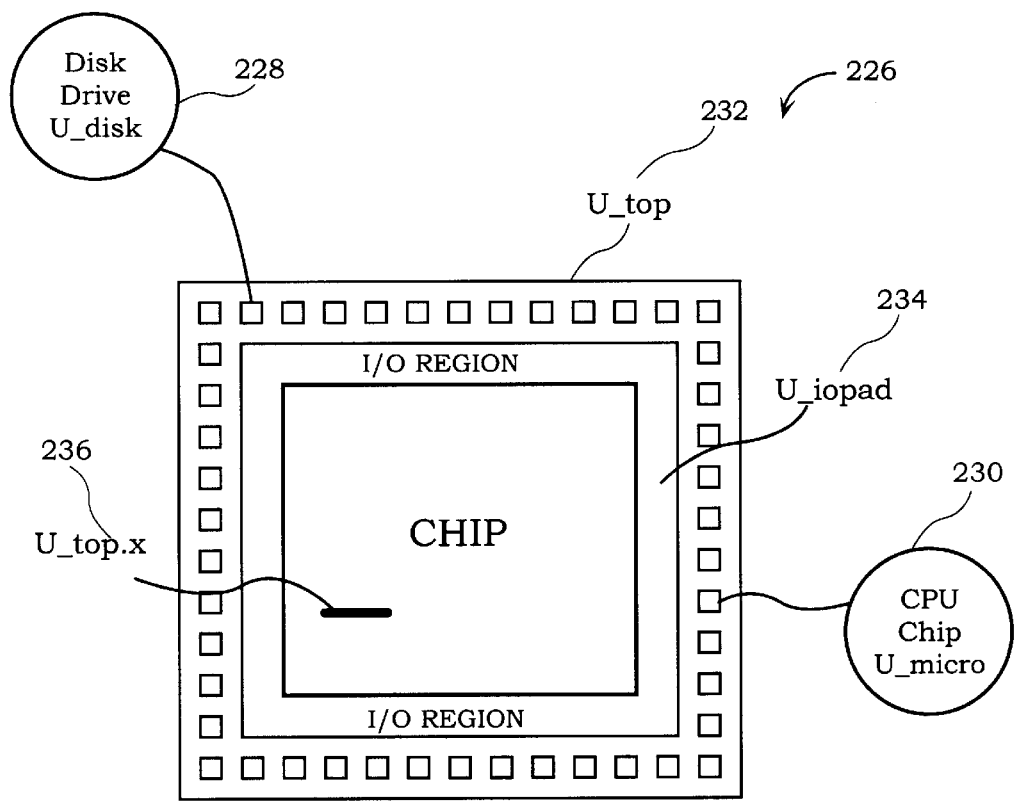
FIGS. 4B and 4C illustrate a more simplified example of a chip design and an associated command line entry in accordance with one embodiment of the present invention.

Setting up the command line generally entails typing in the correct data to enable running the AVF generator and a desired chip design, and its associated instantiations, map file, and netlist. FIG. 4A illustrates the typically commands that may be provided in a command line when it is desired to generate the avf.v file. As shown, a command line 202*a* is provided with a reference to avfgen and associated commands for running the AVF generator. The typical commands include, -V, -P, -0 FILENAME, -M FILENAME, -N FILENAME, -T TOP INSTANCE, -I IOPAD INSTANCE, and -R RESET PIN NUMBER. These identifying commands will therefore assist the AVF generator in producing the proper avf.v file for the desired chip design and associated netlist. FIGS. 4B and 4C illustrate a more simplified example of a chip design 226 and an associated command line entry. For example, the chip design 226 includes associated instantiations for u_top 232, u_iopad 234, and u_top.x 236. These example instantiations identify some characteristics for this simplified chip design 226. Accordingly, the command line entry referenced in 202*a* of FIG. 3 for the simplified chip design 226 would read as shown in FIG. 4C.

Referring once again to FIG. 3, once the setup of the command line is complete, the method will proceed to execute the AVF generator to produce the avf.v file in operation 108. The generation of the avf.v file begins at an operation 204 where a map file is read into memory for the desired chip design. Next, the method will proceed to an operation 206 where the netlist for the chip design is read in order to generate a list of pins based in part from data in the map file that is stored in memory. Once the list of pins have been generated in operation 206, the method will proceed to an operation 208 where output enables for each pin in the chip design are identified.

The method now proceeds to an operation 210 where an AVF data conversion function is defined that considers output enabled data, current pin values, and power-on reset states. Once the AVF data conversion function has been defined in operation 210, the method will proceed to an operation 212 where the list of pins stored in memory are retrieved to generate code that produces timing for a DUT file for each pin in the list of pins. The method now proceeds to an operation 214 where a large display statement (i.e., a Verilog statement) is produced to enable the generation of a line of the AVF file for a particular cycle. In general, generating a display statement includes, performing a function call (for each pin) to the AVF data conversion table (i.e., FIG. 7B), and then taking the result from the function call and placing it into the proper entry location in the AVF file.

After the large display statement has been produced in operation 214, the method proceeds to an operation 216 where a DUT creation code is generated. As will be described below, the DUT creation code is configured to produce the DUT file once the avf.v file produced in 108 is executed along with the test bench. Once the DUT creation code has been generated in operation 216, the method of flowchart 200 will be done. As described above with reference to FIG. 2, the avf.v file 110*b* and other test bench files may then be executed to generate the AVF file 114, the DUT file 116, and the log file 118.

Accordingly, the avf.v file that is produced when the AVF generator is executed, may be used with any number of test files 110*a* and associated models 110*b*, in order to test the true functionality of the chip design under test. Reference may be made to Appendix A, which is an exemplary AVF file that may be generated once the test bench for a particular design is executed. Appendices B-1 through B-3 illustrates an exemplary DUT file 116 that may also be generated when the Verilog test bench executable files are executed.

FIG. 5A illustrates a flowchart 250 that identifies the method operations performed in generating a map file for a particular chip design in accordance with one embodiment of the present invention. The method begins at an operation 252 where cell types and their associated logical functionality are identified from the netlist of the chip design. Once the cell types and their associated logical functions have been identified, the method will proceed to an operation 254 where the method will proceed to a next multiple I/O cell in the netlist for the chip design.

Initially, the method will go to the first multiple I/O cell. Once at the first multiple I/O cell, the method will proceed to an operation 256 where the multiple I/O cell is formatted in an identifying statement. FIG. 5B illustrates one example of a multiple I/O cell that may be part of the chip design. In the example of FIG. 5B, an instance of an oscillator (u_OSC) is provided having a dataport 1 and a dataport 2. The multiple I/O oscillator is shown having a first pin and a second pin. The first pin is assigned pin number 34, and the second pin is assigned pin number 35. Dataport 1 of the first cell is shown having output enabled data .ned 1, and .neu 1. Dataport 2 is shown having output enabled data .ned 2 and .neu 1.

Therefore, for this exemplary multiple I/O cell of FIG. 5B, the identifying statement formatted in operation 256 is shown in FIG. 5C as 256'. This exemplary map file entry will therefore identify the oscillator as being a multiple I/O cell, which is part of the netlist. The method will now proceed to an operation 258 where it is determined if there is a next cell. If there is a next cell, the method will proceed to an operation 252 where the cell types and their associated logical functionality are identified. Now, the method will again proceed to operation 254 where the method will move to the next multiple I/O cell in the netlist for the chip design. Once the next multiple I/O cell in the netlist for the chip design is identified, it will be formatted in a proper identifying statement in operation 256. This method will therefore continue until there are no more multiple I/O cells in the netlist. At that point, the method of generating a map file 250 will be complete.

Figure 5D:
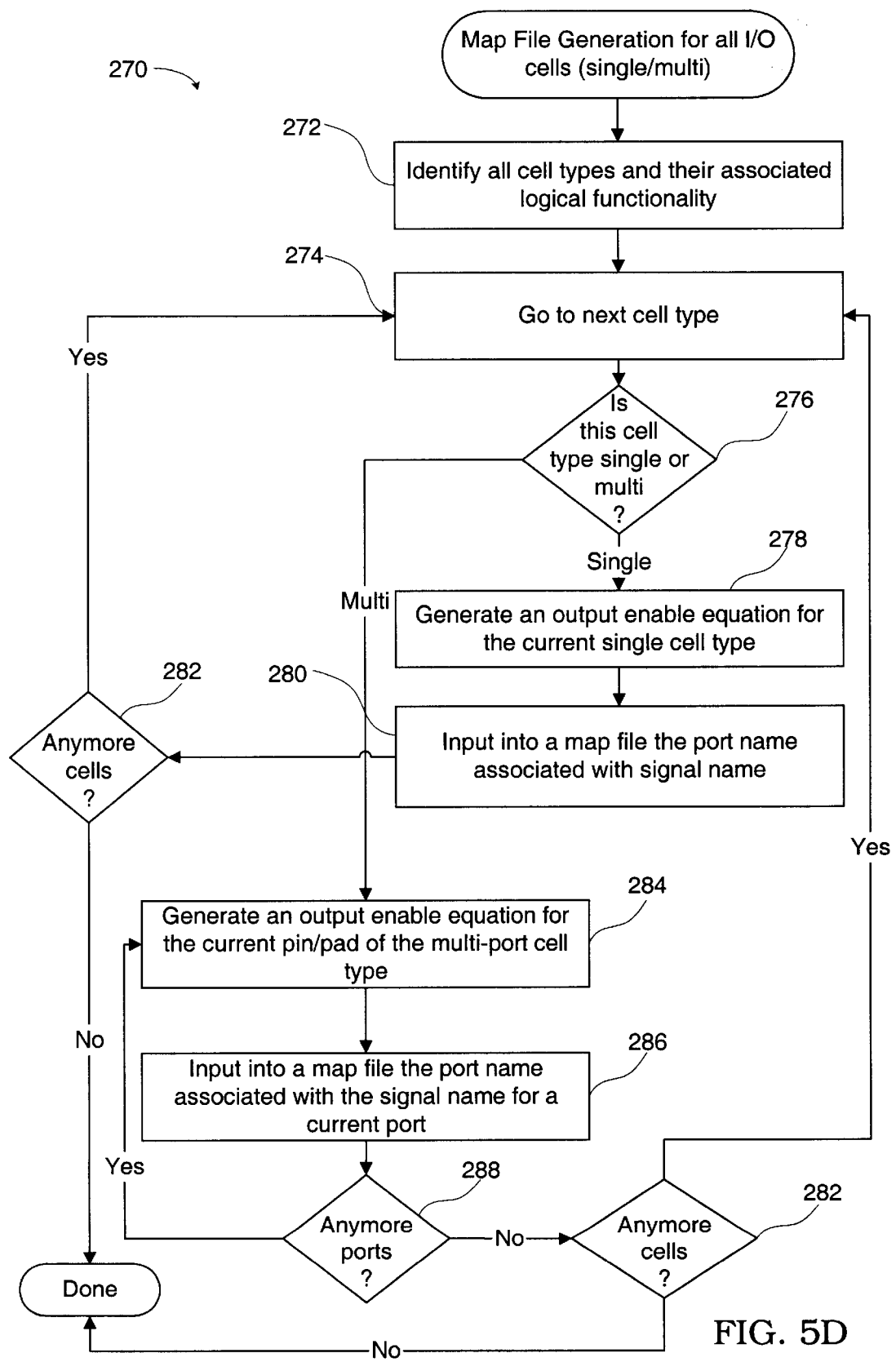
FIG. 5D illustrates the method of generating a map file for all I/O cells, including single and multi port cells, in accordance with one embodiment of the present invention.

FIG. 5D is a flowchart 270 illustrating the method operation performed in generating a map file for all I/O cells including single port cells and multi port cells, in accordance with one embodiment of the present invention. The method begins at an operation 272 where all cell types and their associated logical functionality are identified. Once all cell types have been identified, the method will proceed to an operation 274 where the method will proceed to a next cell type in the list of I/O cells. Initially, the method will begin with the first cell in the list of I/O cells. Then, the method will proceed to a decision operation 276 where it is determined whether the current cell is either a single port or a multi-port cell.

If the current cell is a single-port cell, the method will proceed to an operation 278 where an output-enable equation for the current single-port cell type is generated. Once the output-enable equation has been generated, the method will proceed to an operation 280 where the port name associated with the signal name is input into the map file. Specifically, this operation informs the program where to look for the signal name. This is needed because for each cell type, the signal name will be at a different port. Once operation 280 has been performed, the method will proceed to a decision operation 282 where it is determined whether there are anymore cells in the list of I/O cells. If there are no more cells, the method will be done. Alternatively, if there are more cells, the method will proceed back to operation 274.

Assuming now that the current cell in decision operation 276 is a multi-port cell, then the method will proceed to an operation 284. In operation 284, an output-enable equation will be generated for the current pin/pad of the multi-port cell type. Next, the method will proceed to an operation 286 where the port name associated with the signal name for a current port is input into the map file. Once the input has been performed for the current port, the method will proceed to a decision operation 288 where it is determined whether there are anymore ports in the current multi-port cell. If there are, operations 284 and 286 will be repeated for each port in the multi-port cell. Once all ports have been completed for the multi-port cell, the method will proceed to decision operation 282 where it is determined if there are anymore cells in the list of I/O cells. If there are, the method will again proceed back up to operation 274 where the next cell type will be identified. Alternatively, if it is determined in operation 282 that there are no more cells in the I/O cell list, the method will be done.

An example of the map file entries for single port and multi-port cells is shown in Table A below. Specifically, an example for a single port cell and a multi-port cell have been provided, including the output-enable equations and the pin names.

TABLE A

Exemplary Map File Entries For Single/Multi Port Cells

| Cell Type | Single/Multi | Output-Enable Equation | Pin Name |
| --- | --- | --- | --- |
| Single port cell | | | |
| ioej08 | S | "{NED} && {NEU}" | {PAD}; |
| : | : | : | : |
| Multi port cell | | | |
| ioaj06 | M | "!{OEN} && {SESEL}" "!{OEN}" | {PADP} {PADM}; |
| : | : | : | : |

Figure 6A:
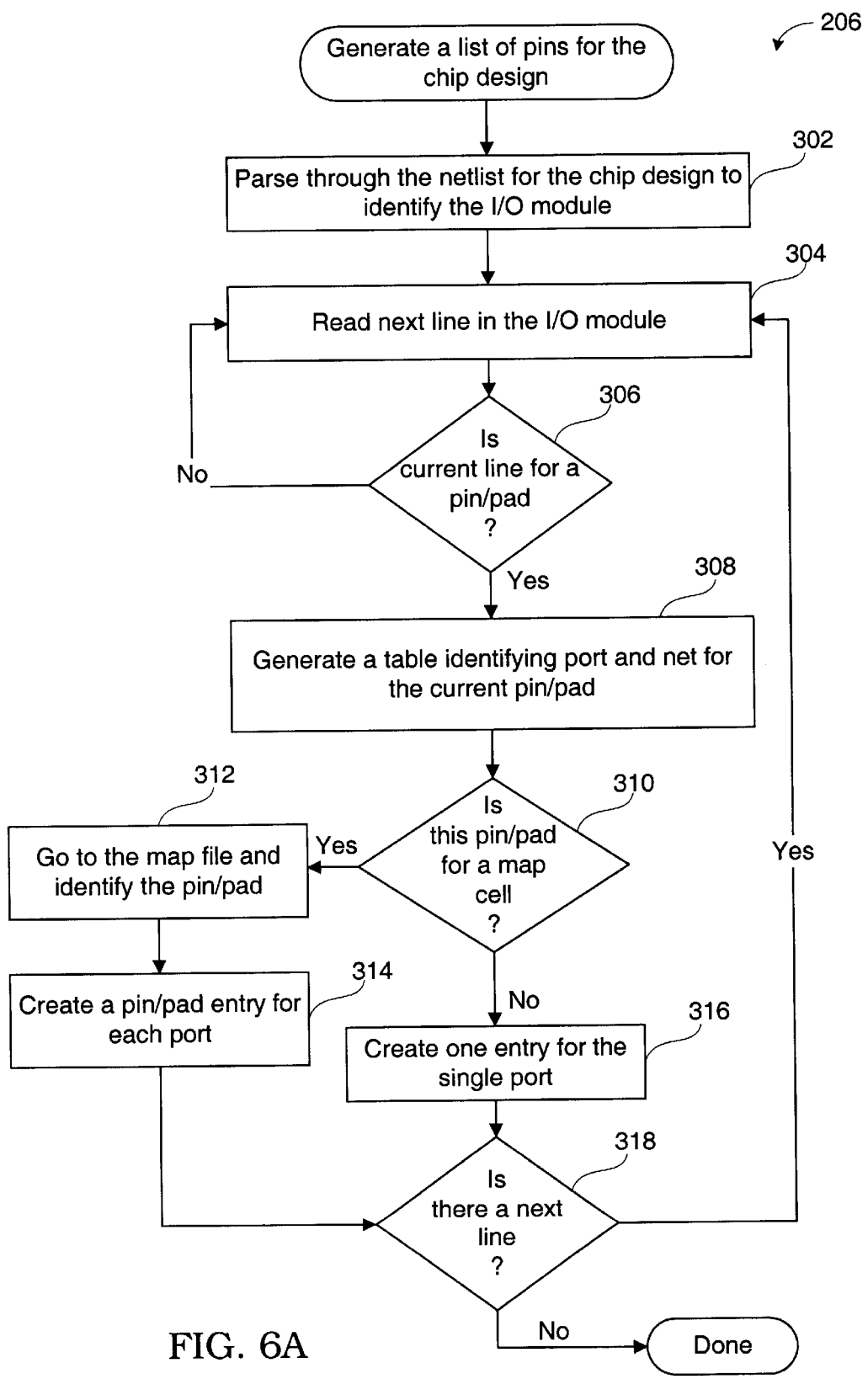
FIG. 6A illustrates an example of the method operations performed in generating a list of pins for the chip design in accordance with one embodiment of the present invention.
Figure 6B:
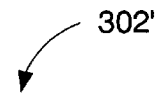
FIGS. 6B through 6D illustrate tables that are implemented during the generation of the AVF file and DUT file data in accordance with one embodiment of the present invention.

FIG. 6A illustrates an example of the method operations performed in generating a list of pins for the chip design in accordance with one embodiment of the present invention. Accordingly, flowchart 206 is a more detailed description of the method operations performed in operation 206 of FIG. 3. The method will begin at an operation 302 where parsing of the netlist of the chip design will be performed to identify the I/O module. FIG. 6B illustrates an example of a port/net table 302' of the netlist for the chip design that may be parsed through during operation 302. As shown, the exemplary table 302' identifies an instance, a cell type, a port and net for the enable information and the signal information, respectively. Once the I/O module has been identified in operation 302, the method will proceed to an operation 304 where the first line in the I/O module is read. Once the first line in the I/O module is read in operation 304, the method will proceed to a decision operation 306 where it is determined if the current line is for a pin or a pad (as used herein, the pin and pad terms are interchangeable).

Figure 6C:
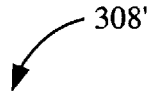

If it is not for a pin or a pad, then it is most likely some other type of logical gate. At that point, the method will proceed back to operation 304 where the next line in the I/O module is read. Once again, the method will proceed to decision operation 306 where it is determined if the current line is for a pin or a pad. When it is determined that it is for a pin or a pad, the method will proceed to an operation 308 where a table identifying port and net for the current pin or pad is generated. As shown in FIG. 6C, table 308' illustrates an example of the generated table for the port and net. The port will identify the output enable data (e.g.,.neu, ned, etc.), and net data will identify the signal data (e.g., signal 1, signal 2, etc.). In this embodiment, the generated table 308' of FIG. 6C will be generated for each line in the I/O module, and then erased from memory. The data in FIG. 6C therefore corresponds to PAD001 in FIG. 6B where the appropriate port and net data is illustrated. When the next line in the I/O module is read, table 308' will be generated anew for the current line.

From operation 308 in FIG. 6A, the method will proceed to a decision operation 310 where it is determined if the current pin or pad is associated with a map cell. As mentioned above, map cells are cells that have multiple I/O ports. If the current pin is for a map cell, the method will proceed to an operation 312 where reference will be made to the map file and the pin or pad is identified.

Figure 6D:
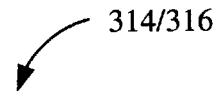

Once the pin or pad in the map file has been identified for the map cell, the method will proceed to an operation 314 where a pin or pad entry is created for each port. Reference is now drawn to FIG. 6D where an example of a port pin/pad entry table is provided. The entry table therefore identifies a port name, a pin or pad number, output enable data, and associated signals. For the exemplary multiple I/O cell of FIG. 5B, the port pin/pad entry table will have an entry for dataport 1, dataport 2, and its associated parameters. These entries will be made in operation 314 of FIG. 6A. On the other hand, if it is determined in operation 310 that the current pin or pad is not for a map cell, the method will proceed to an operation 316 where one entry for the single port is created. As an example, FIG. 6D illustrates a single entry for a pad having a pin or pad number 1 and its associated output enable data and signal data.

At this point, the method will proceed from either operation 314 or 316 to a decision operation 318. In decision operation 318, it is determined whether there is a next line in the I/O module. If there is, the method will proceed back to operation 304 where the next line in the I/O module is read. As mentioned above, an example of a simplified I/O module is shown in FIG. 6B. The method will then proceed filling-in the port pin or pad entry table of FIG. 6D until each line of the I/O module has been read and processed in FIG. 6A to generate a list of pins for the chip design.

Figure 7A:
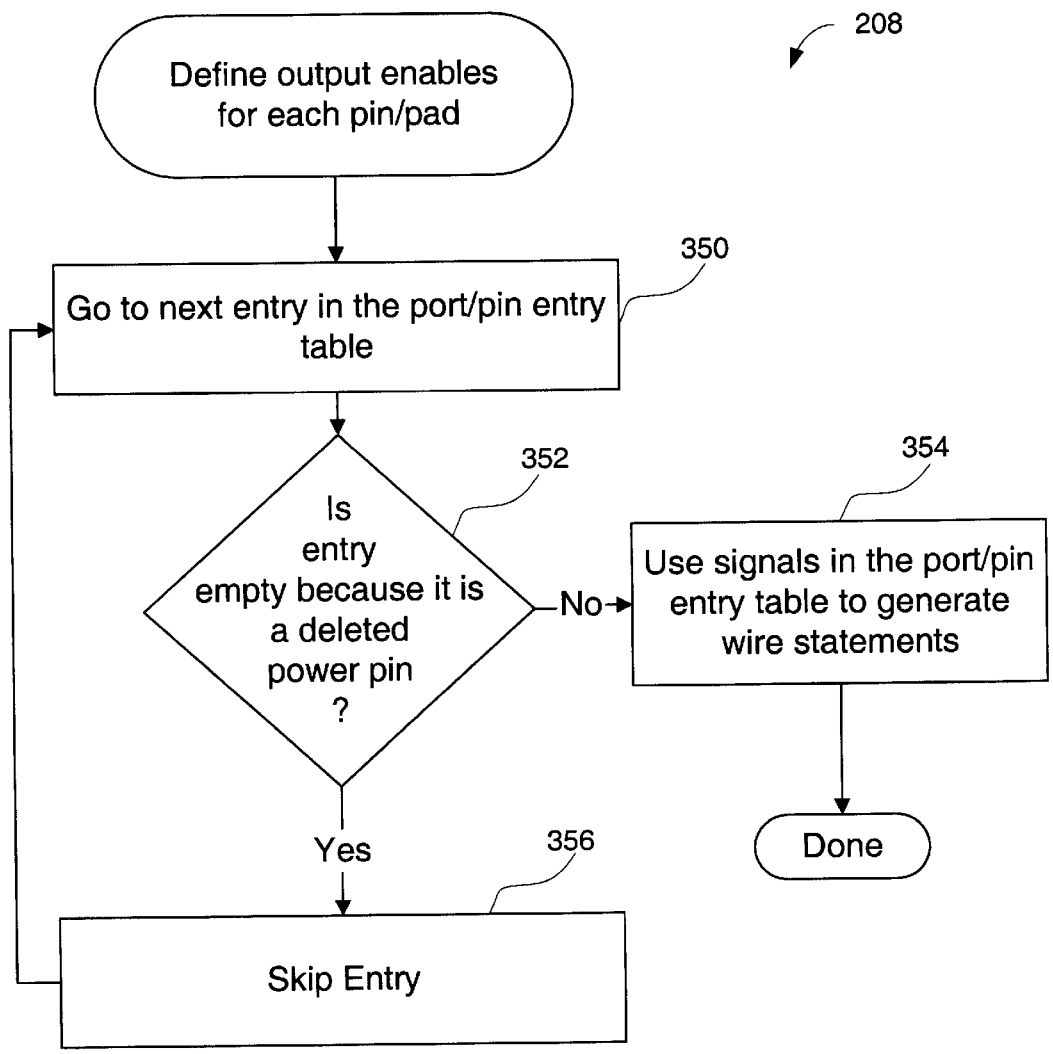
FIG. 7A illustrates a more detailed description of the sub-method operations of an operation of FIG. 3 where output enables are defined for each pin or pad in the chip design, in accordance with one embodiment of the present invention.

FIG. 7A illustrates a more detailed description of the method of operation 208 of FIG. 3 where output enables are defined for each pin or pad in the chip design. The method begins at an operation 350 where the method will go to a next entry in the pin or pad entry table of FIG. 6D, once it has been completed during the method operations of the flowchart of FIG. 6A. The method will now proceed to a decision operation 352 where it is determined whether the entry is empty because it is a deleted power pin. If it is a deleted power pin, the method will skip the entry in operation 356 and proceed back to operation 350. In operation 350, the method will go to the next entry in the port or pin entry table. Once it is determined that the next entry is not empty in operation 352, the method will proceed to an operation 354 where the signals in the port or pin entry table are used to generate wire statements. Exemplary wire statements, familiar to those skilled in the art are shown in Appendix C for completeness.

FIG. 7B illustrates an example of an AVF data conversion table which is defined in operation 210 of FIG. 3. As shown, the AVF data conversion table is used to determine what the AVF data is supposed to be depending upon the power-on reset information, the output enable information, and the value for each pin in a particular cycle.

Figure 8A:
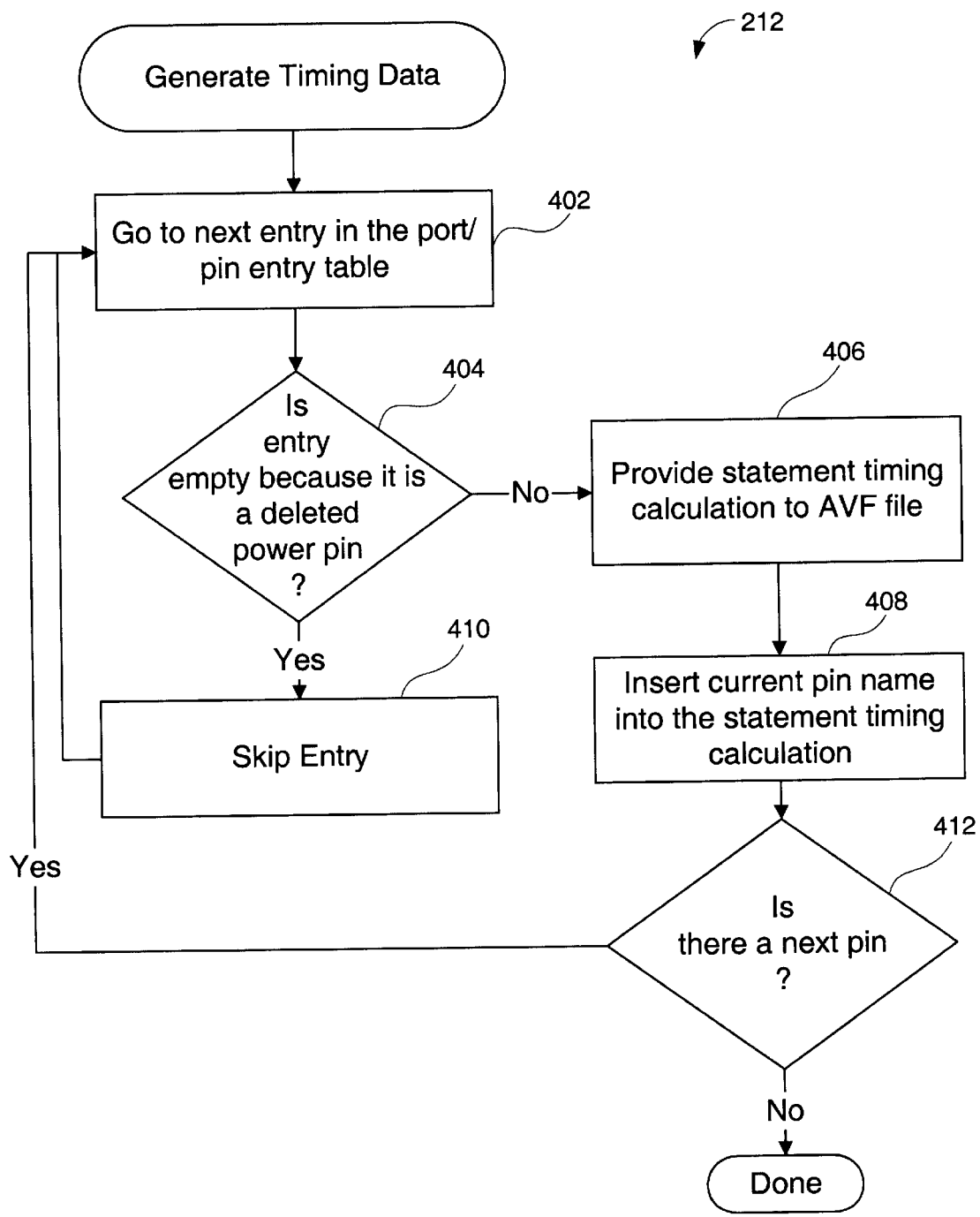
FIG. 8A illustrates the method operations performed when timing data is generated for the production of the DUT file in accordance with one embodiment of the present invention.

FIG. 8A illustrates the method operations performed when timing data is generated for the production of the DUT file. The method begins at an operation 402 where the method proceeds to the next entry in the port or pin entry table which was defined in FIG. 6D. In operation 404, it is determined whether the entry is empty because it is a deleted power pin. If it is a deleted power pin, the method will proceed to an operation 410 where the entry is skipped and the method will proceed back to operation 402. When it is determined that the current entry in the port or pin entry table is not deleted, the method will proceed to an operation 406 where a statement timing calculation is provided to the AVF file.

Next, the method will proceed to an operation 408 where the current pin name is inserted into the statement timing calculation. FIG. 8B provides an exemplary statement timing calculation in accordance with this embodiment. At this point, the method proceeds to a decision operation 412 where it is determined if there is a next pin in the entry table. If there is, the method will again proceed to operation 402. If there are no more pins in the entry table, the method will be done.

Figure 9:
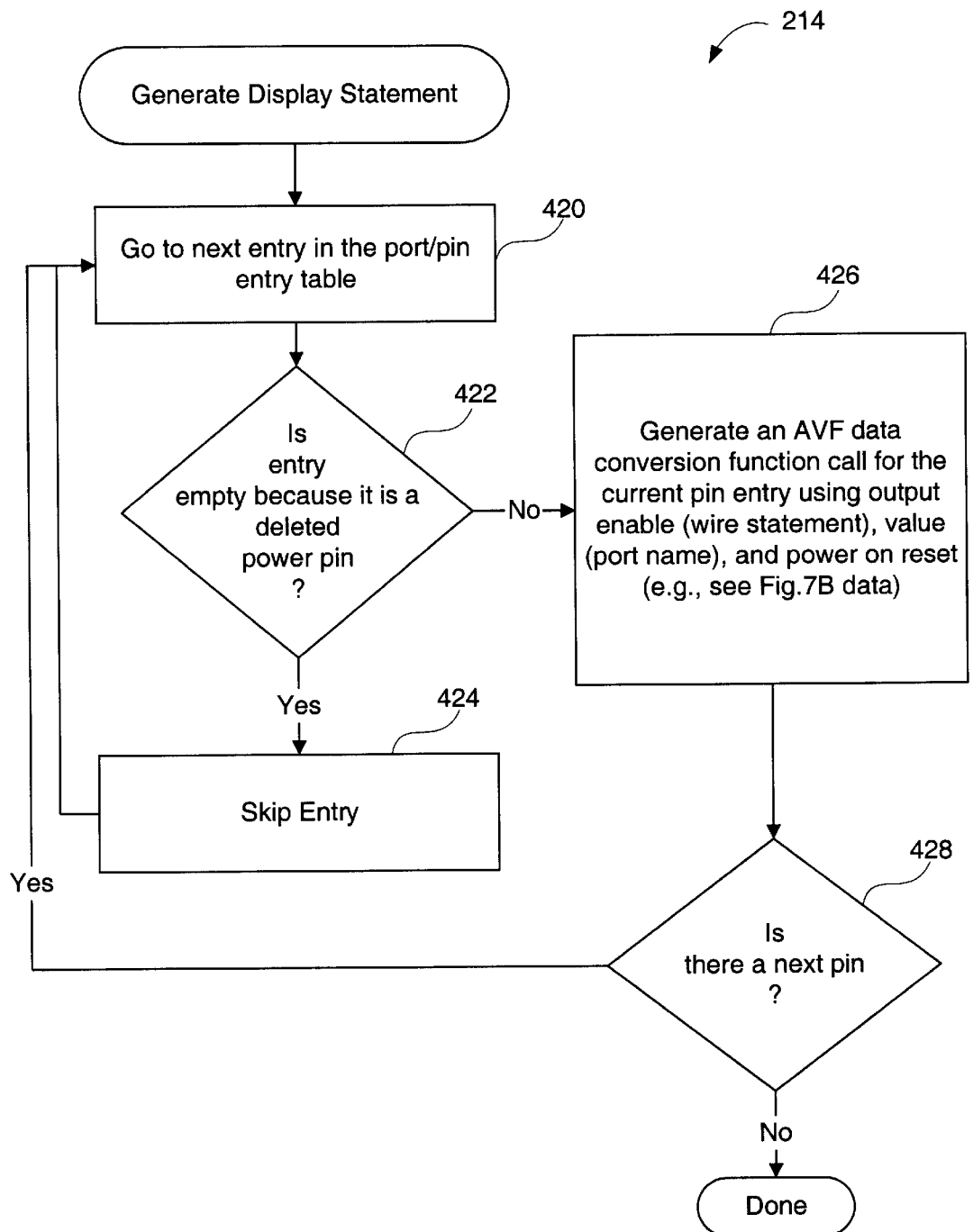
FIG. 9 illustrates a more detailed flowchart diagram of the method operations performed in FIG. 3 when generating a display statement in accordance with one embodiment of the present invention.

FIG. 9 illustrates a more detailed flowchart diagram of the method operations performed in 214 of FIG. 3 when generating a display statement in accordance with one embodiment of the present invention. The method begins at an operation 420 where the method moves to the next entry in the port/pin entry table. The method now moves to an operation 422 where it is determined if the entry is empty because it is a deleted power pin. If it is, the method proceeds to an operation 424 where the entry is skipped and the method moves to operation 420. Once it is determined that the entry is not empty because it was not a deleted power pin, the method will proceed to an operation 426.

In operation 426, an AVF data conversion function call is generated for the current pin entry using output enable data (wire statements), value data (port name), and power-on reset data. Reference should be made to the exemplary output enable data, value data, and power-on reset data provided in the table of FIG. 7B. The AVF data conversion function call is essentially the call that will generate AVF data similar to the AVF file illustrated in Appendix A, once the avf.v file along with the test bench (which are Verilog executables) are executed. Next, the method proceeds to an operation 428 where it is determined if there is a next pin. If there is a next pin, the method will proceed back to operation 420. From operation 420, the method will again proceed to decision operation 422 and then to skip the current entry 424 if the entry is empty because it is a deleted power pin. If it is not a deleted power pin, the method will again proceed to operation 426 and then back to operation 428. Once there are no more pins, the method will be done.

B. AVF Vector Data Verification Loop

Figure 10:
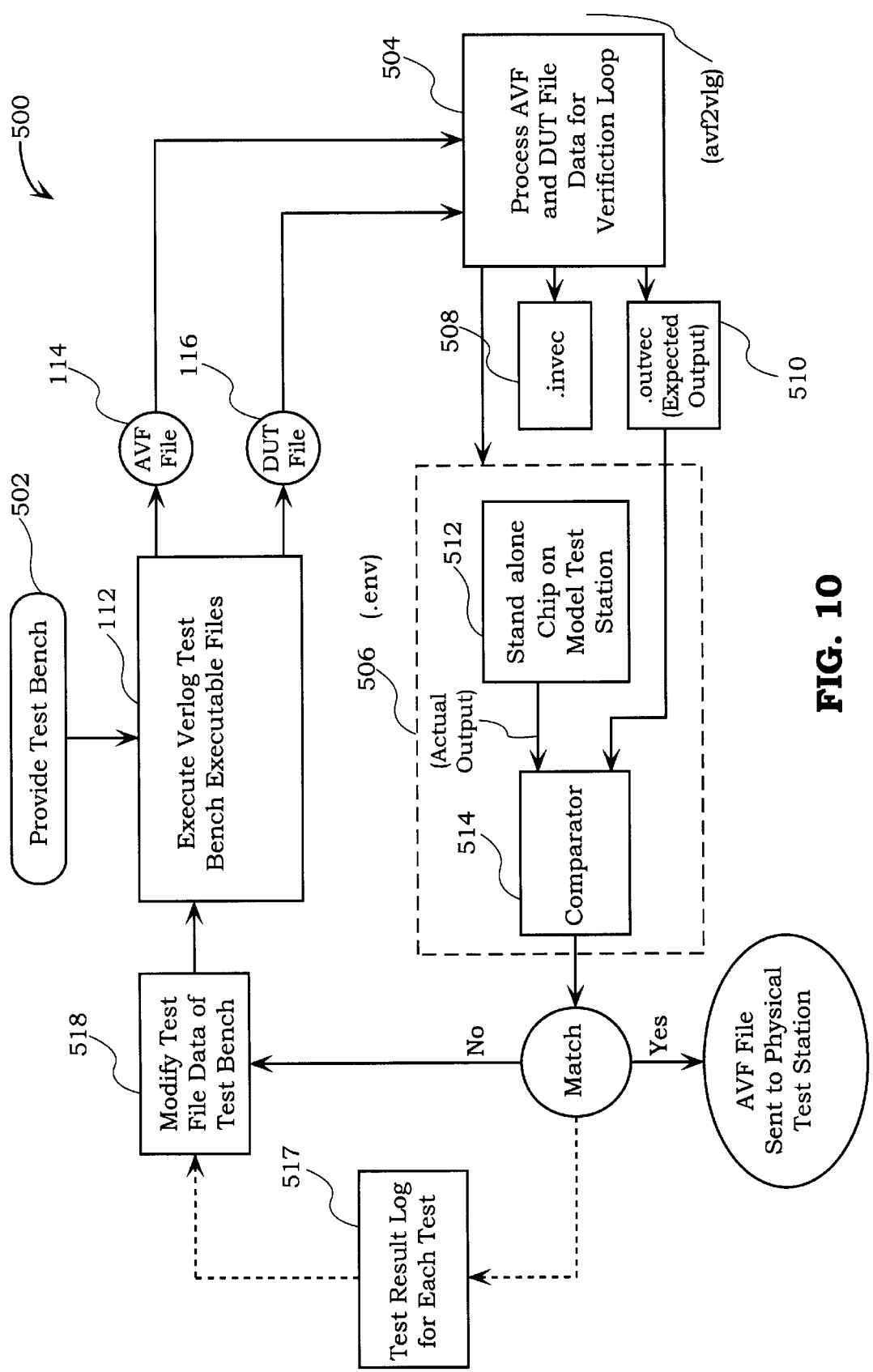
FIG. 10 illustrates a flowchart diagram of an AVF test vector verification loop in accordance with one embodiment of the present invention.

FIG. 10 illustrates a flowchart diagram of an AVF test vector verification loop 500 in accordance with one embodiment of the present invention. As discussed above, the verification loop is performed to substantiate the correctness of the generated AVF file data and the DUT file data that has just been generated. By executing this verification loop, the generated AVF file data and the DUT file data are used to generate input vector data and expected output vector data. The input vector data is then provided to a digital model of the test station having a model of the chip design under test.

The input test vector is then feed to the model test station, which then generates an output that is compared with an expected output. If the output from the model test station matches the expected output, then the AVF file data and the DUT file data will be ready for use in the physical test station.

Reference is again made to FIG. 10, where the verification loop begins at an operation 502 and a test bench is provided. As discussed with reference to FIG. 2 above, the test bench typically includes the generated avf.v file 110b, test files 110a, the netlist for the chip design being tested 110c, and models 110d. Therefore, once the test bench is provided, the test bench files are executed in 112 to generate the AVF file 114 and the DUT file 116.

However, to ensure that the generated AVF file 114 and DUT file 116 are accurate once they are provided to the physical test station, they are processed through the verification loop. In this process, the AVF file 114 and the DUT file 116 are provided to a block 504 (e.g., av2vlg) where the AVF file and the DUT file are processed for use in the verification loop. During the processing, input test data (.invec) 508, output test data (.outvec) 510, and an.env file 506 (e.g., which is an environment file) are produced. In general, the invec 508 is provided to the.env file 506 which has information about a model of a standalone chip which is simulated on a model test station 512. The.outvec 510 is essentially the expected outputs that should be generated once the.env file 506 is executed.

Once the.env 506 is executed, an actual output will be provided to a comparator 514. The.outvec 510, which is the expected output, is also provided to the comparator 514. If the expected output and the actual output match, then the AVF file is ready for use in the actual physical test station. However, if a match is not produced by the comparator 514, the loop will continue to a block 518 where the test file data of the test bench is modified to fix any timing errors that may have caused the "actual output" to not match the "expected output."

After the modification to the test file has been performed, the loop will again cause the test bench to be executed to generate another AVF file 114 and another DUT file 116. The AVF test vector verification loop 500 will therefore continue to be processed (if desired by the test engineer, because less than a perfect match may be acceptable in certain cases) until the comparator 514 determines that the actual output coming from the standalone chip on the model test station 512, matches the expected output from the.outvec 510. At that point, the AVF file should function properly with the actual physical test station hardware and properly test the integrity of the chip design being tested. In another embodiment, each time a test of the test files is run, the results of the verification are provided to a test result log 517 (which may be a long log of all of the run tests). In one embodiment of the present invention, a test engineer can examine the test result log 517 and determine if the verification loop should be run again after modifications are made to the test file data of the test bench.

It should also be noted that because the standalone chip on the model test station is actually a computer model of the test station, complete test coverage testing can also be performed during the model testing stage. As can be appreciated, this a substantial advance in the art.

Figure 11A:
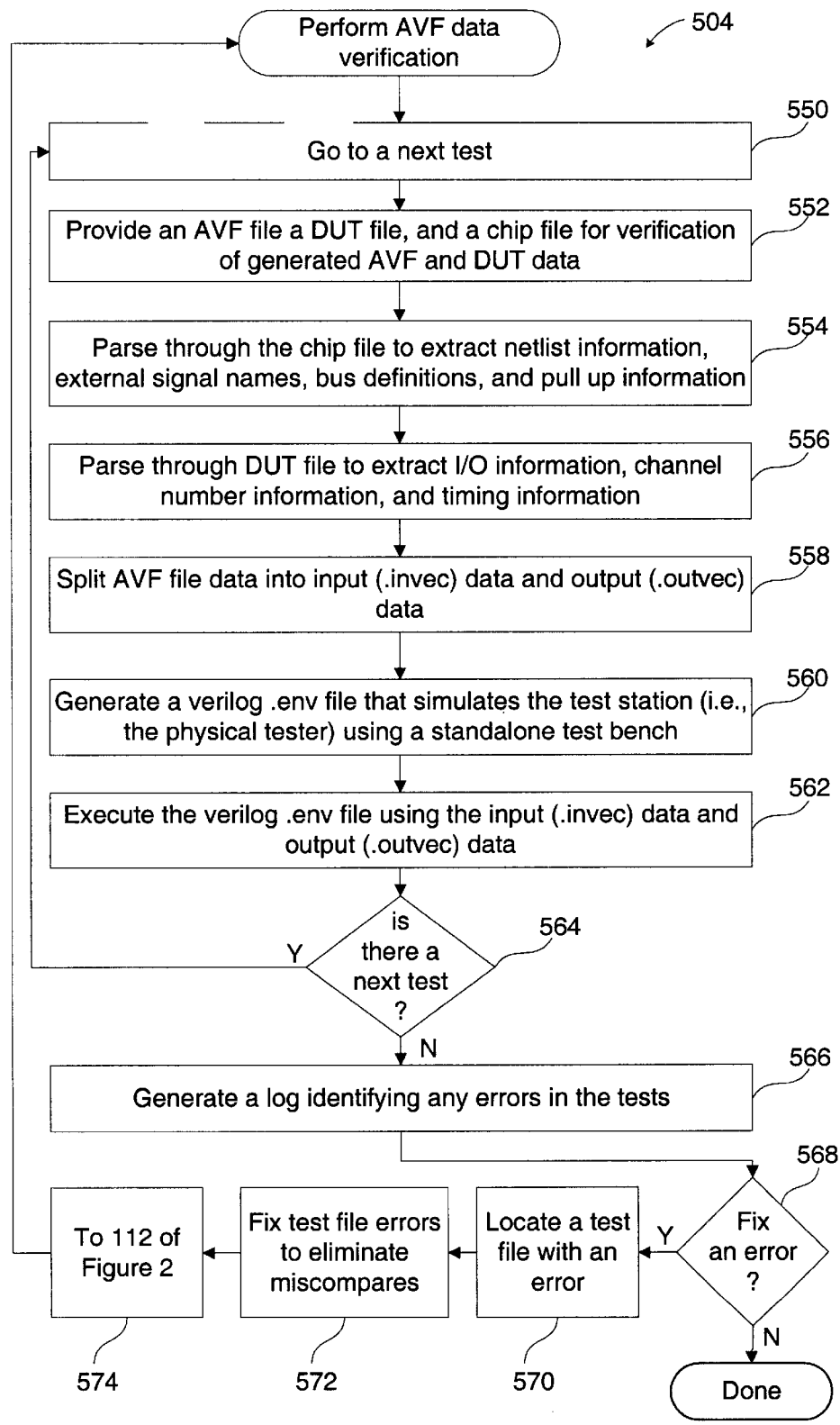
FIG. 11A illustrates a flowchart identifying the operations performed during AVF data verification in accordance with one embodiment of the present invention.
Figure 11B:
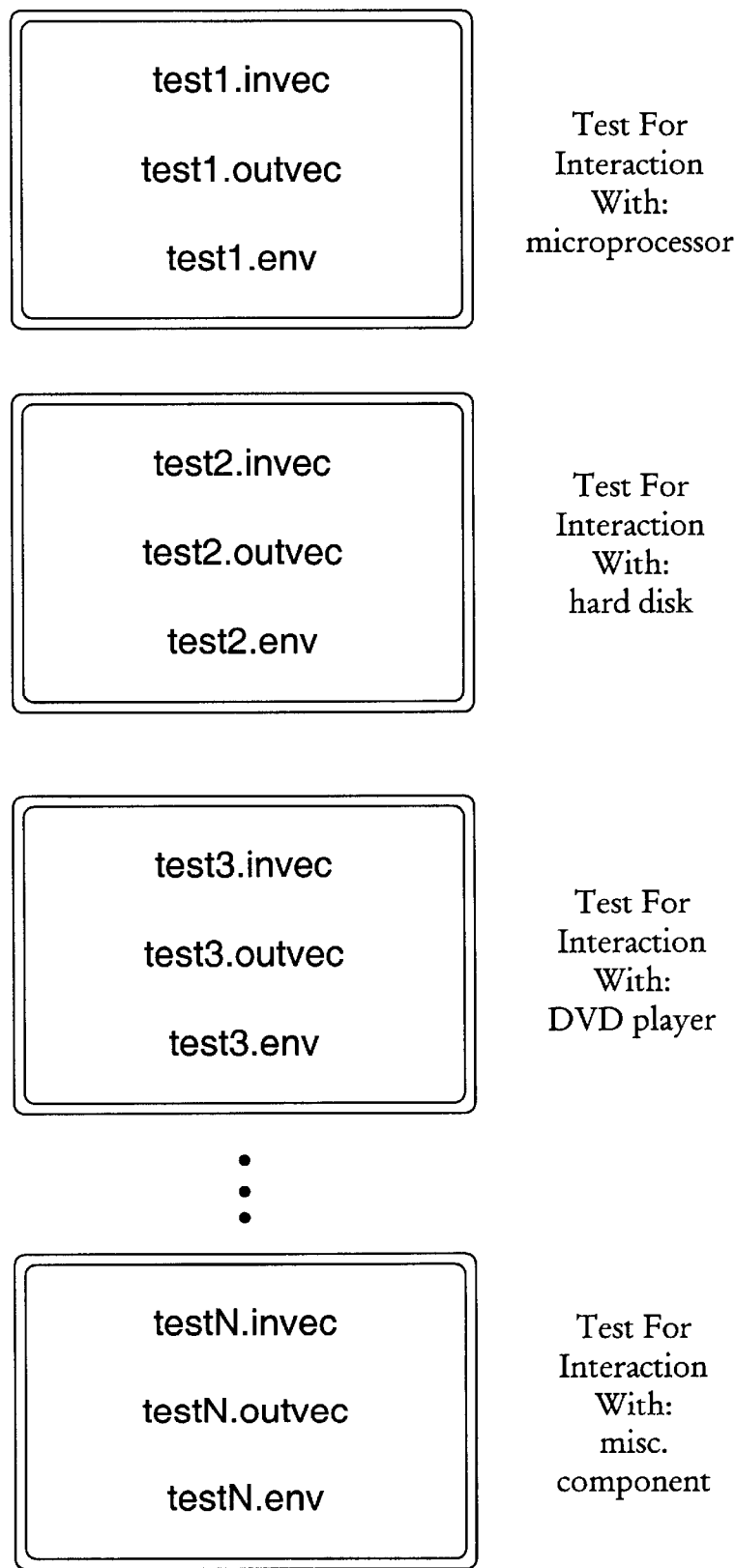
FIG. 11B illustrates pictorial examples of a multitude of tests that may be run as part of the test files in order to stimulate the chip design under test, in accordance with one embodiment of the present invention.

FIG. 11A illustrates a flowchart 504 identifying the operations performed during AVF data verification in accordance with one embodiment of the present invention. The method begins at an operation 550 where the method will go to a first test that is identified in the test files 110a in a particular test bench. Thus, FIG. 11B illustrates a plurality of tests which may be run during verification of the AVF data. For example, a first test may include a test 1.invec file, a test 1.outvec file, and a test 1.env file. The first test may be, for example, to test the interaction of the chip design with a given microprocessor. A second test may be to test the interaction of the chip design with a hard disk drive. A third test may be to test the chip design's interaction with a DVD player. Of course, the test files 110a may include many more tests in the range of hundreds or even many thousands of different tests to test the interaction of the chip design with its expected real world stimulation when the packaged chip is used for its intended purpose.

Reference is again drawn to FIG. 11A where the method continues in operation 552 where an AVF file and a DUT file is provided, and a chip file for the verification of generated AVF and DUT data is made available. Reference may be made to Appendix D which identifies an exemplary chip file. The chip file includes an identification of a netlist, pullup data, external signal names (e.g., chip wiring to external components), and bus declarations. Once the AVF file, the DUT file, and the chip file have been provided for verification in operation 552, the method will proceed to an operation 554. In operation 554, the method will parse through the chip file to extract netlist information, external signal name information, bus definition information, and pullup information.

Once the parsing through the chip file has been completed, the method will proceed to an operation 556 where a parsing through the DUT file to extract I/O information, channel member information, and timing information is performed. As mentioned above, an exemplary DUT file is shown in Appendices B-1 through B-3. The method then proceeds to an operation 558 where the AVF file data is split into input data (.invec), and output data (.outvec). After the AVF data has been split, the method will proceed to an operation 560 where a Verilog.env file is generated that simulates the test station (i.e., the physical tester) using a standalone test bench. The standalone test bench will basically include the netlist for the chip design being tested.

Next, the method will proceed to an operation 562 where the Verilog.env file is executed using the input data and the output data. With reference to FIG. 10, the .env file 506 is executed using the standalone chip on the model test station 512, including the comparator 514. Once executed, a determination is made as to whether the expected output matches the output from the standalone chip on the model test station. At this point, the method will proceed to a decision operation 564 where it is determined if there is a next test. As shown in FIG. 11B, there are typically many more tests that are run during the verification stage.

Accordingly, for the next test, the method will proceed back up to operation 550 where the method will go to the next test. Once it is determined that there are no more tests, a log is generated identifying any errors in the tests in operation 566. At this point, the test engineer can analyze the generated log to determine if any of the errors should be fixed in operation 568. If fixing the errors is desired, the method will proceed to an operation 570 where a test file having a particular error is located. Once the test file is located, the method will proceed to operation 572 where the test file errors are fixed to attempt to eliminate miscompares. Once the test file errors have been fixed, the method will proceed to operation 574 where the method will return to operation 112 of FIG. 2, where the test bench is executed. The execution of the test bench is also pictorially shown in FIG. 10.

At that point, a new AVF file and DUT file are generated, and verification of the AVF data can again be performed, if desired. Alternatively, if it is determined in operation 568 that there are no errors to fix, it will be assumed that the execution of the .env file produced actual outputs from the standalone chip on the model test station that matched the expected outputs. In that case, the method will be done. At the same time, if the errors are such that further verification is not desired, the method will also be done from the determination of operation 568.

Figure 12:
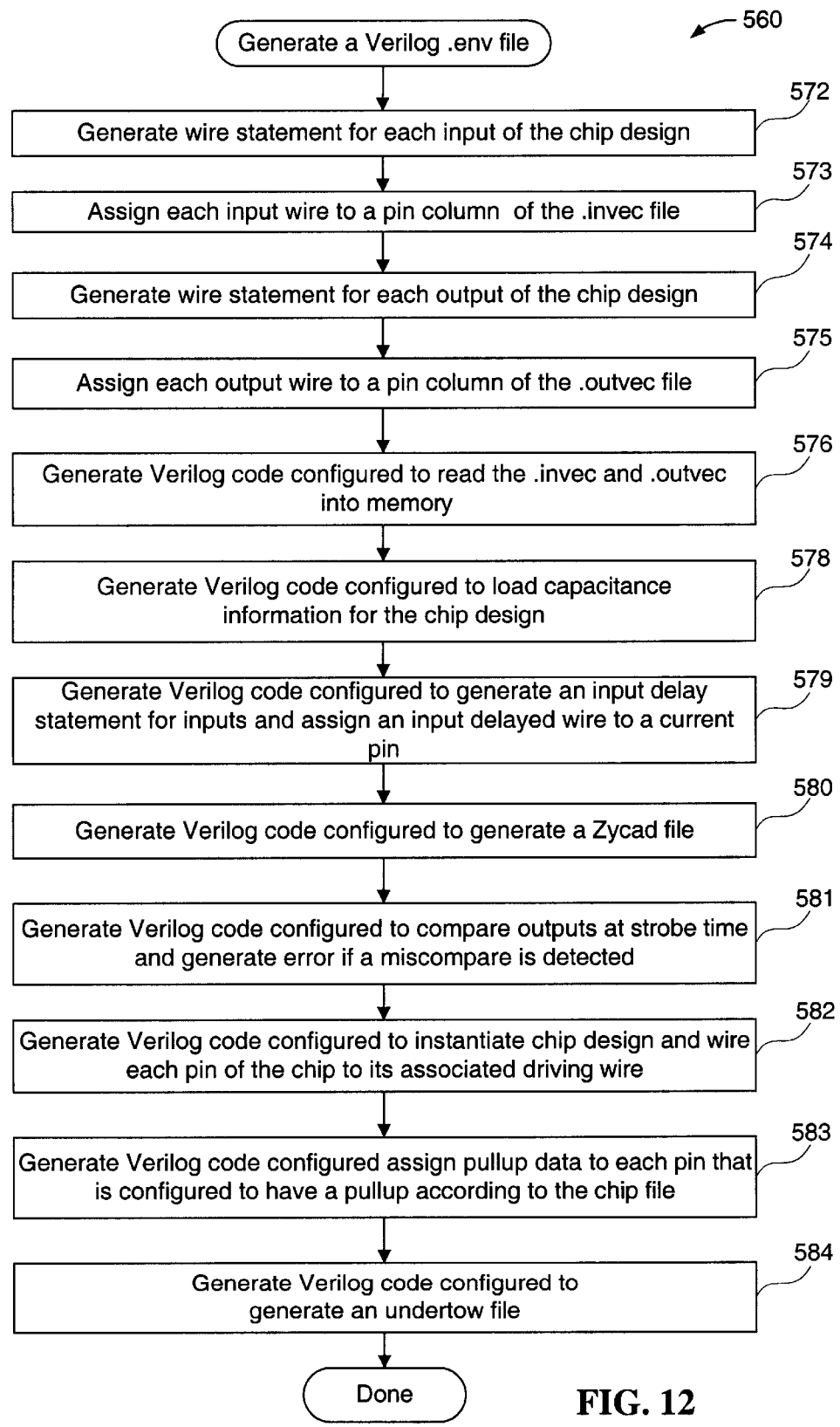
FIG. 12 illustrates a flowchart that describes the generation of a Verilog environment file that is subsequently executed in an operation of FIG. 11A, in accordance with one embodiment of the present invention.

FIG. 12 illustrates a flowchart 560 that describes the generation of a Verilog .env file that is subsequently executed in operation 562 of FIG. 11A. The method of generating a Verilog .env file begins at an operation 572 where wire statements for each input of the chip design are generated. Next, the method will move to an operation 573 where each input pin is assigned to a pin column of the invec file. In general, the .invec file is arranged in a memory array having columns for each pin in the chip design, and a row number for each cycle in a test. Next, the method will proceed to an operation 574 where wire statements for each output of the chip design is generated.

Once wire statements have been generated, the method will proceed to an operation 575 where each output wire is assigned to a pin column of the.outvec file. The method now proceeds to an operation 576 where Verilog code configured to read the invec and.outvec data into memory is generated. Once that set of code is generated, the method will proceed to an operation 578 where Verilog code configured to load capacitance information for the chip design is generated. As is well known, the chip wiring has particular capacitance for the various wires that should be approximated during the modeling of the chip design in order to approximate the actual true physical chip design circuit. Next, the method will proceed to an operation 579 where Verilog code configured to generate an input delay statement for inputs is generated. Verilog code is also generated to assign an input-delay wire to a current pin. An example of an input-delay wire is shown below.

wire #delay signalname_drv=signalname_input

Typical input-delay statements of the present invention can handle non-return to 0, return to 1, and return 0 statements. In the above example, each time the "signalname_input" changes, the "signalname_drv" will also change after a given "delay" that is specified in the input delay wire statement.

The method will then proceed to and operation 580 where Verilog code configured to generate a Zycad file is generated. The Zycad file is a fault creating file that applies inputs and can determine what amount of test coverage is achieved during a particular test. This test coverage testing will, therefore, closely if not identically, approximate the test coverage achieved in the true integrated circuit device being tested on the physical test station.

From operation 580, the method will proceed to an operation 581 where Verilog code configured to compare outputs at a strobe time and generate an error if a miscompare is detected, is generated. In this exemplary design, the strobe is set for 90 percent of a given cycle. Next, the method will proceed to an operation 582 where Verilog code configured to instantiate the chip design and wire each pin of the chip to its associated driving wire, is generated.

At this point, the method will proceed to an operation 583 where Verilog code will assign a pullup to each pin that is configured to have a pullup according to the chip file, is generated. Once the pullup information has been configured, the method will proceed to an operation 584 where Verilog code configured to generate an undertow file is generated. An undertow file is one that can be executed using a well known undertow program that enables computer graphical inspection of signals to facilitate debugging of errors. At this point, the method will be done. As mentioned above, the .env file generated in flowchart 560 is then subsequently executed along with the standalone chip on the model test station and the invec data to determine whether the output produced from the standalone chip on the model test station will match the expected output (i.e.,.outvec).

If a match is achieved, the AVF file data and the DUT file data will be considered to be appropriate for running on the physical test station. However, if the comparison determines that the actual outputs do not match the expected outputs, a test log will be generated for each of the files identifying where errors in comparisons were detected. At that point, the test engineer can decide whether further loops through the AVF test vector verification loop 500 of FIG. 10 should be executed in order to produce a suitable AVF file for use on the physical test station.

The present invention may be implemented using any type of integrated circuit logic, state machines, or software driven computer-implemented operations as described above. By way of example, a hardware description language (HDL) based design and synthesis program may be used to design the silicon-level circuitry necessary to appropriately perform the data and control operations in accordance with one embodiment of the present invention. Although any suitable design tool may be used, a hardware description language "Verilog®" tool available from Cadence Design Systems, Inc. of Santa Clara, Calif., is used.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

| APPENDIX A |
|---|
| EXAMPLE GENERATED AVF FILE |
| 111X111111X11111X11X1111111111XH101L0001XLL111111X111X1XH00H11HXHHHHHHHHHHHHX0X |
| 111X111111X11111X11X1111111111XH101L0001XLL111111X111X0XH00H11HXHHHHHHHHHHHHX0X |
| 111X111111X11111X11X1111111111XH101L0001XLL111111X111X1XH00H11HXHHHHHHHHHHHHX0X |
| 111X111111X11111X11X1111111111XH101L0001XLL111111X111X0XH00H11HXHHHHHHHHHHHHX0X |
| 111X111111X11111X11X1111111111XH101L0001XLL111111X111X1XH00H11HXHHHHHHHHHHHHX0X |
| 111X111111X11111X11X1111111111XH101L0001XLL111111X111X0XH00H11HXHHHHHHHHHHHHX0X |
| 111X111111X11111X11X1111111111XH101L0001XLL111111X111X1XH00H11HXHHHHHHHHHHHHX0X |
| 111X111111X11111X11X1111111111XH101L0001XLL111111X111X0XH00H11HXHHHHHHHHHHHHX0X |
| 111X111111X11111X11X1111111111XH101L0001XLL111111X111X1XH00H11HXHHHHHHHHHHHHX0X |
| 111X111111X11111X11X1111111111XH101L0001XLL111111X111X0XH00H11HXHHHHHHHHHHHHX0X |
| 111X111111X11111X11X1111111111XH101L0001XLL111111X111X1XH00H11HXHHHHHHHHHHHHX0X |
| 111X111111X11111X11X1111111111XH101L0001XLL111111X111X0XH00H11HXHHHHHHHHHHHHX0X |
| 111X111111X11111X11X1111111111XH101L0001XLL111111X111X1XH00H11HXHHHHHHHHHHHHX0X |
| 111X111111X11111X11X1111111111XH101L0001XLL111111X111X0XH00H11HXHHHHHHHHHHHHX0X |
| 111X111111X11111X11X1111111111XH101L0001XLL111111X111X1XH00H11HXHHHHHHHHHHHHX0X |
| 111X111111X11111X11X1111111111XH101L0001XLL111111X111X0XH00H11HXHHHHHHHHHHHHX0X |
| 111X111111X11111X11X1111111111XH101L0001XLL111111X111X1XH00H11HXHHHHHHHHHHHHX0X |
| 111X111111X11111X11X1111111111XH101L0001XLL111111X111X0XH00H11HXHHHHHHHHHHHHX0X |

| APPENDIX B-1 |
|---|
| Example DUT File (Timing) |

```
DUT_DESCR_FILE
( Author         "ATELink User"
  DESIGNNAME     "ASIC_DESIGN"
  LOCATION       "ASIC_FOUNDRY"
)
declare
    simmap  (
    simstate         Isifstate         osifstate 0                0                 0
        1                1                 1
        L                L                 L
        H                H                 H
        Z                Z                 Z
        Z                Z                 Z
        X                X                 X
        X                X                 X
        I                I                 X
            )
```

| APPENDIX B-2 Cont'd Example DUT File (Timing) | | |
|---|---|---|
| signal_list | | |
| inout | HD0 | (channel = 1); |
| inout | HD1 | (channel = 2); |
| inout | HD2 | (channel = 3); |
| inout | HD3 | (channel = 5); |
| inout | HD4 | (channel = 6); |
| inout | HD5 | (channel = 7); |
| inout | HD6 | (channel = 8); |
| inout | HD7 | (channel = 9); |
| inout | HD8 | (channel = 10); |
| inout | HD9 | (channel = 12); |
| inout | HD10 | (channel = 13); |
| inout | HD11 | (channel = 14); |
| inout | HD12 | (channel = 15); |
| inout | HD13 | (channel = 16); |
| inout | HD14 | (channel = 18); |
| inout | HD15 | (channel = 19); |
| inout | DASP_HSSTROBE | (channel = 21); |
| inout | PDIAG_HSGRANT_ | (channel = 22); |
| inout | HCS0_HSERROR | (channel = 23); |
| input | HCS1_HMBR | (channel = 24); |
| input | HA0 | (channel = 25); |
| input | HA1 | (channel = 26); |
| input | HA2 | (channel = 27); |
| inout | IOR_ | (channel = 28); |
| inout | IOW_ | (channel = 29); |
| inout | IOCHRDY | (channel = 30); |
| output | IOCS16_HSBR | (channel = 32); |
| input | HRST_ | (channel = 33); |
| inout | DMARQ | (channel = 34); |
| input | DMACK_HMREQ | (channel = 35); |
| inout | IRQ | (channel = 36); |
| inout | EOS_SGRANT | (channel = 37); |
| | | |
| inout | AD0 | (channel = 114); |
| output | INTHB_INTHBD | (channel = 116); |
| inout | INTD_MA12 | (channel = 117); |

-3-

| APPENDIX B-3 |
|---|
| Cont'd Example DUT File (Timing) |
| timing Cycle ( period = 20ns; |
|     FORCE stimulus REFCLK (format = R1, delay = 3.15ns, width = 10ns); |
|     FORCE stimulus RCLK (format = DNRET, delay = 1ns); |
|     FORCE stimulus ALE_INPUT2_CDRINT (format = DNRET, delay = 1ns); |
|     FORCE stimulus R_WR_ (format = DNRET, delay = 4ns); |
|     FORCE stimulus AD5 (format = DNRET, delay = 0ns); |
|     FORCE stimulus AD3 (format = DNRET, delay = 0ns); |
|     FORCE stimulus POR_ (format = DNRET, delay = 4ns); |
|     FORCE stimulus HD0 (format = DNRET, delay = 0ns); |
|     FORCE stimulus HD1 (format = DNRET, delay = 0ns); |
|     FORCE stimulus HD2 (format = DNRET, delay = 0ns); |
|     FORCE stimulus HD3 (format = DNRET, delay = 0ns); |
|     FORCE stimulus HD4 (format = DNRET, delay = 0ns); |
|     FORCE stimulus HD5 (format = DNRET, delay = 0ns); |
|     FORCE stimulus HD6 (format = DNRET, delay = 0ns); |
|     FORCE stimulus HD7 (format = DNRET, delay = 0ns); |
|     FORCE stimulus HD8 (format = DNRET, delay = 0ns); |
|     FORCE stimulus HD9 (format = DNRET, delay = 0ns); |
|     FORCE stimulus HD10 (format = DNRET, delay = 0ns); |
|     FORCE stimulus HD11 (format = DNRET, delay = 0ns); |
|     FORCE stimulus HD12 (format = DNRET, delay = 0ns); |
|     FORCE stimulus HD13 (format = DNRET, delay = 0ns); |
|     FORCE stimulus HD14 (format = DNRET, delay = 0ns); |
|     FORCE stimulus HD15 (format = DNRET, delay = 0ns); |
|     FORCE stimulus DASP_HSSTROBE (format = DNRET, delay = 0ns); |
|     FORCE stimulus PDIAG_HSGRANT_ (format = DNRET, delay = 0ns); |
|     FORCE stimulus HCS0_HSERROR (format = DNRET, delay = 0ns); |
|     FORCE stimulus HCS1_HMBR_ (format = DNRET, delay = 0ns); |
|     FORCE stimulus HA0 (format = DNRET, delay = 0ns); |
|     FORCE stimulus HA1 (format = DNRET, delay = 0ns); |
|     FORCE stimulus HA2 (format = DNRET, delay = 0ns); |
|     FORCE stimulus IOR_ (format = DNRET, delay = 0ns); |

APPENDIX C
WIRE DECLARATIONS FOR I/O ENABLES AND RESET

| |
|---|
| wire hd0_oen = test.u_top.u_iopad.n127_ && test.u_top.u_iopad.n127_ && test.u_to |
| wire hd1_oen = test.u_top.u_iopad.n127_ && test.u_top.u_iopad.n127_ && test.u_to |
| wire hd2_oen = test.u_top.u_iopad.n127_ && test.u_top.u_iopad.n127_ && test.u_to |
| wire hd3_oen = test.u_top.u_iopad.n127_ && test.u_top.u_iopad.n127_ && test.u_to |
| wire hd4_oen = test.u_top.u_iopad.n127_ && test.u_top.u_iopad.n127_ && test.u_to |
| wire hd5_oen = test.u_top.u_iopad.n127_ && test.u_top.u_iopad.n127_ && test.u_to |
| wire hd6_oen = test.u_top.u_iopad.n127_ && test.u_top.u_iopad.n127_ && test.u_to |
| wire hd7_oen = test.u_top.u_iopad.ihd7oen_ && test.u_top.u_iopad.ihd7oen_ && test |
| : |
| wire dasp_hsstrobe_oen = test.u_top.u_iopad.idasp_hsstrobeoen_ && test.u_top.u_i |
| wire pdiag_hsgrant_oen = test.u_top.u_iopad.ipdiag_hsgrant_oen_ && test.u_top.u |
| wire hsc0_hserror_oen = test.u_top.u_iopad.ihcs0_hserroroen_ && test.u_top.u_iop |
| wire ior_oen = test.u_top.u_iopad.hctloen_ && test.u_top.u_iopad.hctloen_ ; |
| wire iow_oen = test.u_top.u_iopad.hctloen_ && test.u_top.u_iopad.hctloen_ ; |
| wire iochrdy_oen = test.u_top.u_iopad.iiochrdyoen_ && test.u_top.u_iopad.iiochrd |
| wire iocs16_hsbr_oen = test.u_top.u_iopad.eniocs16od && 1'b0 ; |
| wire dmarq_oen = test.u_top.u_iopad.idmarqoen_ && test.u_top.u_iopad.idmargoen_ |
| : |
| wire nrz7_oen = test.u_top.u_iopad.inrz7_3oen_ && test.u_top.u_iopad.inrz7_3oen_ |
| wire nrz6_oen = test.u_top.u_iopad.inrz7_3oen_ && test.u_top.u_iopad.inrz7_3oen_ |
| wire nrz5_oen = test.u_top.u_iopad.inrzy_3oen_ && test.u_top.u_iopad.inrz7_3oen_ |
| wire nrz4_oen = test.u_top.u_iopad.inrz7_3oen_ && test.u_top.u_iopad.inrz7_3oen_ |
| wire nrz3_oen = test.u_top.u_iopad.inrz7_3oen_ && test.u_top.u_iopad.inrz7_3oen_ |
| wire nrz2_wclk_oen = test.u_top.u_iopad.inrz2oen_ && test.u_top.u_iopad.inrz2oen |
| wire nrz1_oen = test.u_top.u_iopad.inrz1oen_ && test.u_top.u_iopad.inrz1oen_ ; |
| : |
| wire ba10_oen = test.u_top.u_iopad.btestoen_ && test.u_top.u_iopad.btestoen_ ; |
| wire ba9_oen = test.u_top.u_iopad.btestoen_ && test.u_top.u_iopad.btestoen_ ; |
| wire ba8_oen = test.u_top.u_iopad.btestoen_ && test.u_top.u_iopad.btestoen_ ; |
| wire ba7_oen = test.u_top.u_iopad.btestoen_ && test.u_top.u_iopad.btestoen_ ; |
| wire ba6_oen = test.u_top.u_iopad.btestoen_ && test.u_top.u_iopad.btestoen_ ; |
| wire ba5_oen = test.u_top.u_iopad.btestoen_ && test.u_top.u_iopad.btestoen_ ; |
| : |
| wire bd14_pse10_oen = test.u_top.u_iopad.ibdhoen_ && test.u_top.u_iopad.ibdhoen_ ; |
| wire bd13_pmux_oen = test.u_top.u_iopad.ibdhoen_ && test.u_top.u_iopad.ibdhoen_ ; |
| wire bd12_csp_oen = test.u_top.u_iopad.ibdhoen_ && test.u_top.u_iopad.ibdhoen_ ; |
| wire bd11_bsp_oen = test.u_top.u_iopad.ibdhoen_ && test.u_top.u_iopad.ibdhoen_ ; |
| wire bd10_rsel_oen = test.u_top.u_iopad.ibdhoen_ && test.u_top.u_iopad.ibdhoen_ ; |
| wire bd9_cslat_oen = test.u_top.u_iopad.ibdhoen_ && test.u_top.u_iopad.ibdhoen_ ; |
| wire: bd8_oen = test.u_top.u_iopad.ibdhoen_ && test.u_top.u_iopad.ibdhoen_ ; |
| : |
| wire bd5_oen = test.u_top.u_iopad.ibdloen_ && test.u_top.u_iopad.ibdloen_ ; |
| wire bd4_oen = test.u_top.u_iopad.ibdloen_ && test.u_top.u_iopad.ibdloen_ ; |
| wire bd3_oen = test.u_top.u_iopad.ibdloen_ && test.u_top.u_iopad.ibdloen_ ; |
| wire bd2_oen = test.u_top.u_iopad.ibdloen_ && test.u_top.u_iopad.ibdloen_ ; |
| : |
| wire ad4_oen = test.u_top.u_iopad.adoen_ && test.u_top.u_iopad.adoen_ ; |
| wire ad3_oen = test.u_top.u_iopad.adoen_ && test.u_top.u_iopad.adoen_ ; |
| wire ad2_oen = test.u_top.u_iopad.adoen_ && test.u_top.u_iopad.adoen_ ; |
| : |
| wire ma1_oen = test.u_top.u_iopad.imaoen_ && test.u_top.u_iopad.imaoen_ ; |
| wire ma0_oen = test.u_top.u_iopad.imaoen_ && test.u_top.u_iopad.imaoen_ ; |
| wire por_ = test.u_top.por_; |

APPENDIX D

Example Chip File

| |
|---|
| top.opus.va (Netlist for a chip design) |
| Pullup DATA |
| Pullup ( sd_[15] , sd_[14] , sd_[13] , sd_[12] , sd_[11] , sd_[10] , sd_[9] , sd_[8] , sd_[7] ,sd_[6] , sd_[5] , sd_[4] , sd_[3] , sd_[2] , sd_[1] , sd_[0] , sdp_[1] , sdp_[0] , atn_, req_, ack_, cd_, io_, msg_, srst_, sel_, bsy_, inthb_inthbd_ , intd ) ; |
| EXTERNAL SIGNAL NAMES (Chip Wiring to External Components) |
| module top ( ack_, atn_, bsy_, cd_, io_, msg_, req_, sd_, sdp_, sel_, srst_, f20rr, sdloen_hgrant_, targ_hreq, selo_hstrobe, bsyo_herror, sdhoen_srst_teststb2, xmit15_arben_hbr_, xmit14_init_dbr, xmit13_sid3, xmit12_sid2, xmit11_sid1, xmit10_sid0, xmit9_ma7, xmit8_ma6, xmit7_ma5, xmit6_ma4, xmit5_ma3, xmit4_ma2, xmit3_ma1, xmit2_ma0, xmit1_bdp1_mal1, xmit0_bdp0_ma10, biclk, ba11_ras1_, ba, bd15_pse11, bd14_pse10, bd13_pmux, bd12_csp, bd11_bsp, bd10_rsel, bd9_dmode, bd8_bmmode, bd, ras0_, cas0_, cas1_write1_, write_, eos, sector, syncf_index, rg, wg, wrfault, nrz7, nrz6, nrz5, nrz4, nrz3, nrz2, nrz1, nrz0, rclk, teststb1_nrzp, por_, cs, bs, r_wr_, e_rd_ds_, ale, ready_dsack_, ad, inthb_inthbd, intd, ma9, ma8 ); |
| BUS DECLARATIONS |
| output [10 : 0] <br><br>inout [7 : 0]   ad; <br>inout [7 : 0]   bd; <br>inout [15 : 0]  sd_; <br>inout [1 : 0]   sdp_; |

What is claimed is:

1. An automated test vector verification method, comprising:

receiving an AVF test file of an integrated circuit design;
receiving a DUT test file of the integrated circuit design;
executing the AVF test file and the DUT test file to produce an input vector, an environment file, and an expected output vector;
providing the input vector to a standalone chip on a model test station;
executing the environment file that causes the input vector to be processed through the standalone chip on the model test station, the executing configured to produce an output vector from the model test station;
comparing the output vector from the model test station with the expected output vector;
modifying a test file data that is used to generate the AVF test file data and the DUT test file data;
generating a new AVF test file data and a new DUT test file data;
running the automated test vector verification method using the new AVF test file data and the new DUT test file data; and
determining whether the comparing produces a match that indicates that the AVF test file data is free of errors.

2. An automated test vector verification method as recited in claim 1, further comprising:

running the automated test vector verification method for a plurality of test files of the AVF test file data; and
generating a test result log.

3. An automated test vector verification method as recited in claim 2, further comprising:

analyzing the test result log; and
re-running the automated test vector verification method for selected ones of the plurality of test files after a modification of the selected ones of the plurality of test files is performed.

4. An automated test vector verification method as recited in claim 1, further comprising:

providing a chip file for the integrated circuit design; and
parsing through the chip file to extract a netlist of the integrated circuit design, external signal names, bus definitions, and pull up information.

5. An automated test vector verification method as recited in claim 4, further comprising:

parsing through the DUT test file data to extract I/O information, channel number information, and timing information.

6. An automated test vector verification method as recited in claim 5, further comprising:

splitting data of the AVF test file data into the input vector and the expected output vector.

7. An automated test vector verification method as recited in claim 1, wherein the generation of the environment file further comprises:

generating a first wire statement for each input of the integrated circuit design;
assigning each of the inputs to a pin column of the input vector;
generating a second wire statement for each output of the integrated circuit design; and
assigning each of the outputs to a pin column of the expected output vector.

8. An automated test vector verification method as recited in claim 6, further comprising:

generating verilog code to read the input vector and the expected output vector into a RAM memory.

9. An automated test vector verification method as recited in claim 7, further comprising:

generating verilog code to load capacitance information for the integrated circuit design.

10. An automated test vector verification method as recited in claim 7, further comprising:

generating verilog code to generate an input delay statement for the inputs and assign an input delay wire to a current pin.

11. An automated test vector verification method as recited in claim 10, further comprising:

generating verilog code to generate a Zycad file.

12. An automated test vector verification method as recited in claim 11, further comprising:

generating verilog code to compare the expected output vector and the output vector, and generate an error statement if a miscompare is detected.

13. An automated test vector verification method as recited in claim 12, further comprising:

generate verilog code to instantiate the integrated circuit design and wire each pin of the integrated circuit design to an associated driving wire.

14. An automated test vector verification method as recited in claim 13, further comprising:

generate verilog code to assign pull up data to each of the pins configured to have the pull up data according to the integrated circuit design.

15. An automated test vector verification method as recited in claim 14, further comprising:

generate verilog code to generate an undertow file.

* * * * *